United States Patent
Tanaka et al.

(10) Patent No.: US 8,426,324 B2
(45) Date of Patent: Apr. 23, 2013

(54) MANUFACTURING METHOD OF MEMORY ELEMENT, LASER IRRADIATION APPARATUS, AND LASER IRRADIATION METHOD

(75) Inventors: Koichiro Tanaka, Isehara (JP); Hirotada Oishi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 47 days.

(21) Appl. No.: 13/080,812

(22) Filed: Apr. 6, 2011

(65) Prior Publication Data
US 2011/0183500 A1   Jul. 28, 2011

Related U.S. Application Data

(62) Division of application No. 11/698,940, filed on Jan. 29, 2007, now Pat. No. 7,940,441.

(30) Foreign Application Priority Data

Feb. 3, 2006   (JP) ................................. 2006-026884

(51) Int. Cl.
*H01L 21/26* (2006.01)

(52) U.S. Cl.
USPC .... 438/795; 438/487; 438/525; 257/E21.028; 257/E21.347; 257/E21.475; 257/E21.134

(58) Field of Classification Search .................. 438/487, 438/525, 795; 257/E21.028, E21.134, E21.347, 257/E21.475
See application file for complete search history.

(56) References Cited

U.S. PATENT DOCUMENTS

| | | | |
|---|---|---|---|
| 4,468,084 | A | 8/1984 | Hutcheson et al. |
| 5,278,679 | A | 1/1994 | Davis et al. |
| 5,684,617 | A | 11/1997 | Langhans |
| 5,691,541 | A | 11/1997 | Ceglio et al. |
| 6,031,201 | A | 2/2000 | Amako et al. |
| 6,376,799 | B1 | 4/2002 | Amako et al. |

(Continued)

FOREIGN PATENT DOCUMENTS

| EP | 0656241 A | 6/1995 |
|---|---|---|
| EP | 1357590 A | 10/2003 |

(Continued)

OTHER PUBLICATIONS

International Search Report (Application No. PCT/JP2007/051322) dated May 1, 2007.

(Continued)

*Primary Examiner* — Andy Huynh
(74) *Attorney, Agent, or Firm* — Eric J. Robinson; Robinson Intellectual Property Law Office, P.C.

(57) ABSTRACT

A method for manufacturing a memory element is proposed. A laser beam emitted from a laser oscillator is entered into a deflector, and a laser beam which has passed through the deflector is entered into a diffractive optical element to be diverged into a plurality of laser beams. Then, a photoresist formed over an insulating film is irradiated with the laser beam which is made to diverge into the plurality of laser beams, and the photoresist irradiated with the laser beam is developed so as to selectively etch the insulating film.

5 Claims, 24 Drawing Sheets

U.S. PATENT DOCUMENTS

| | | |
|---|---|---|
| 6,462,307 B1 | 10/2002 | Hennig et al. |
| 6,548,820 B1 | 4/2003 | Mermelstein |
| 6,563,567 B1 | 5/2003 | Komatsuda et al. |
| 6,635,850 B2 | 10/2003 | Amako et al. |
| 6,841,827 B2 | 1/2005 | Koga |
| 6,870,554 B2 | 3/2005 | Jain |
| 6,897,405 B2 | 5/2005 | Cheng et al. |
| 6,897,889 B2 | 5/2005 | Tanaka |
| 7,068,414 B2 | 6/2006 | Sunagawa et al. |
| 7,094,452 B2 | 8/2006 | Yamashita et al. |
| 7,127,810 B2 | 10/2006 | Kasuga et al. |
| 7,180,575 B2 | 2/2007 | Kasumi et al. |
| 7,183,148 B2 | 2/2007 | Yazaki et al. |
| 7,220,627 B2 | 5/2007 | Yamazaki et al. |
| 7,259,039 B2 | 8/2007 | Lan et al. |
| 7,259,082 B2 | 8/2007 | Tanaka |
| 7,397,592 B2 | 7/2008 | Tanaka |
| 7,405,114 B2 | 7/2008 | Oishi |
| 7,436,032 B2 | 10/2008 | Kato |
| 7,476,629 B2 | 1/2009 | Tanaka |
| 7,499,305 B2 | 3/2009 | Nomura et al. |
| 7,504,327 B2 | 3/2009 | Yamazaki et al. |
| 7,526,858 B2 | 5/2009 | Kasuga et al. |
| 7,532,378 B2 | 5/2009 | Tanaka et al. |
| 7,542,129 B2 | 6/2009 | Sandstrom |
| 7,566,010 B2 | 7/2009 | Yamazaki et al. |
| 7,666,722 B2 | 2/2010 | Koyama |
| 2002/0021426 A1 | 2/2002 | Mei et al. |
| 2002/0105733 A1 | 8/2002 | Hendriks et al. |
| 2002/0164069 A1 | 11/2002 | Nagano et al. |
| 2004/0182831 A1 | 9/2004 | Cheng et al. |
| 2004/0183855 A1 | 9/2004 | Cheng et al. |
| 2004/0195222 A1 | 10/2004 | Tanaka et al. |
| 2004/0241340 A1 | 12/2004 | Sato et al. |
| 2005/0061981 A1* | 3/2005 | Allen et al. ............... 250/353 |
| 2005/0139582 A1 | 6/2005 | Tanaka |
| 2005/0146006 A1* | 7/2005 | Yamazaki et al. ............ 257/679 |
| 2005/0247684 A1 | 11/2005 | Tanaka |
| 2006/0039651 A1 | 2/2006 | Sandstrom |
| 2006/0087635 A1 | 4/2006 | Kazumi et al. |
| 2006/0243713 A1 | 11/2006 | Sato et al. |
| 2007/0153565 A1 | 7/2007 | Nomura et al. |
| 2007/0184639 A1 | 8/2007 | Tanaka et al. |
| 2007/0195834 A1 | 8/2007 | Tanaka et al. |
| 2007/0197049 A1 | 8/2007 | Tanaka et al. |

FOREIGN PATENT DOCUMENTS

| | | |
|---|---|---|
| EP | 1369731 A | 12/2003 |
| EP | 1547719 A | 6/2005 |
| JP | 08-276288 | 10/1996 |
| JP | 2000-275581 A | 10/2000 |
| JP | 2000-280085 A | 10/2000 |
| JP | 2001-105166 | 4/2001 |
| JP | 2001-273778 A | 10/2001 |
| JP | 2001-345431 A | 12/2001 |
| JP | 2002-228818 | 8/2002 |
| JP | 2002-292487 | 10/2002 |
| JP | 2003-051556 A | 2/2003 |
| JP | 2003-217994 A | 7/2003 |
| JP | 2004-306127 | 11/2004 |
| JP | 2004-356235 A | 12/2004 |
| JP | 2005-116682 A | 4/2005 |
| JP | 2005-511312 | 4/2005 |
| JP | 2005-203763 | 7/2005 |
| JP | 2005-268774 | 9/2005 |
| JP | 2005-275325 A | 10/2005 |
| WO | WO 03/047805 | 6/2003 |
| WO | WO-2005/011014 | 2/2005 |
| WO | WO 2005/081307 | 9/2005 |

OTHER PUBLICATIONS

Written Opinion (Application No. PCT/JP2007/051322) dated May 1, 2007.

* cited by examiner

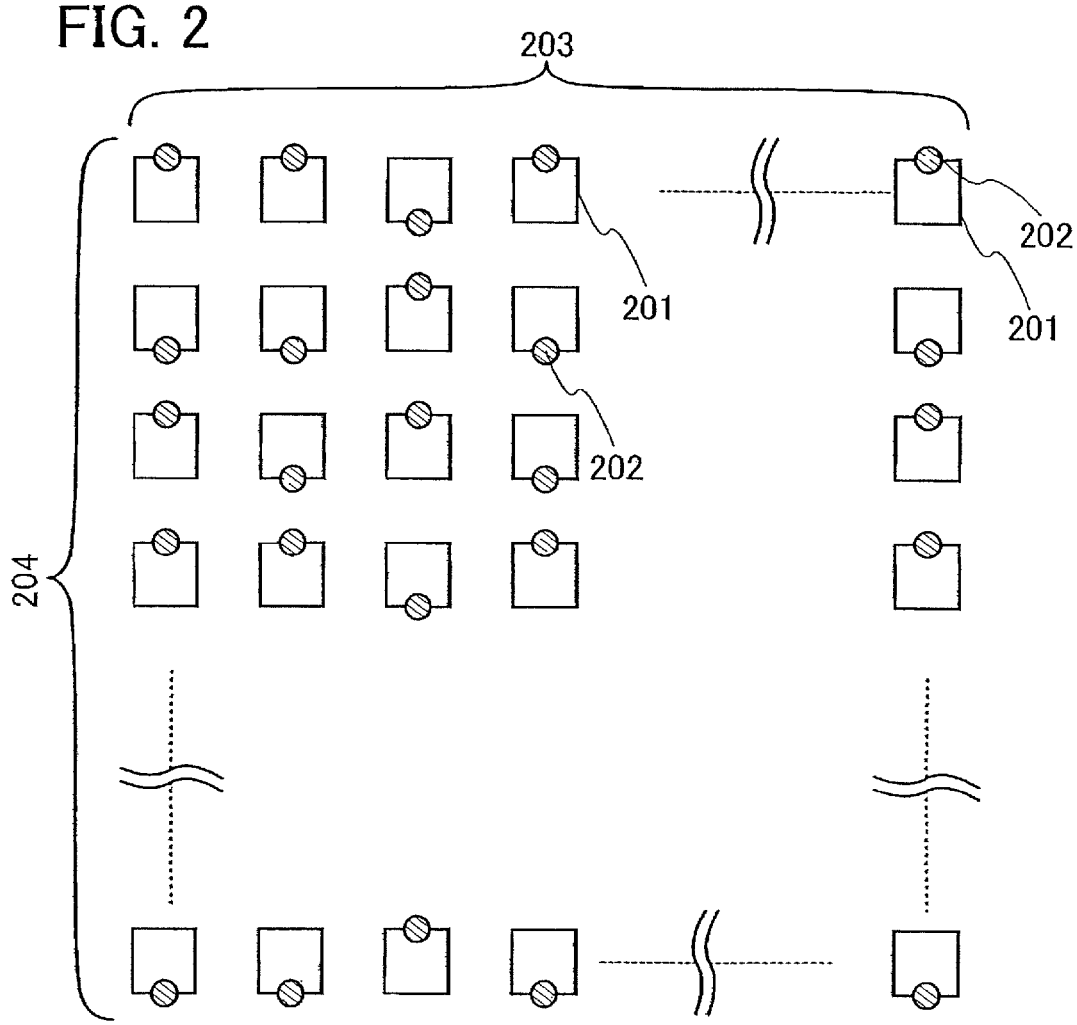

(1) (2) (3) (4) (5) (6) (7) (8) (9) (10) (11) (12) (13) (14) (15) (16)

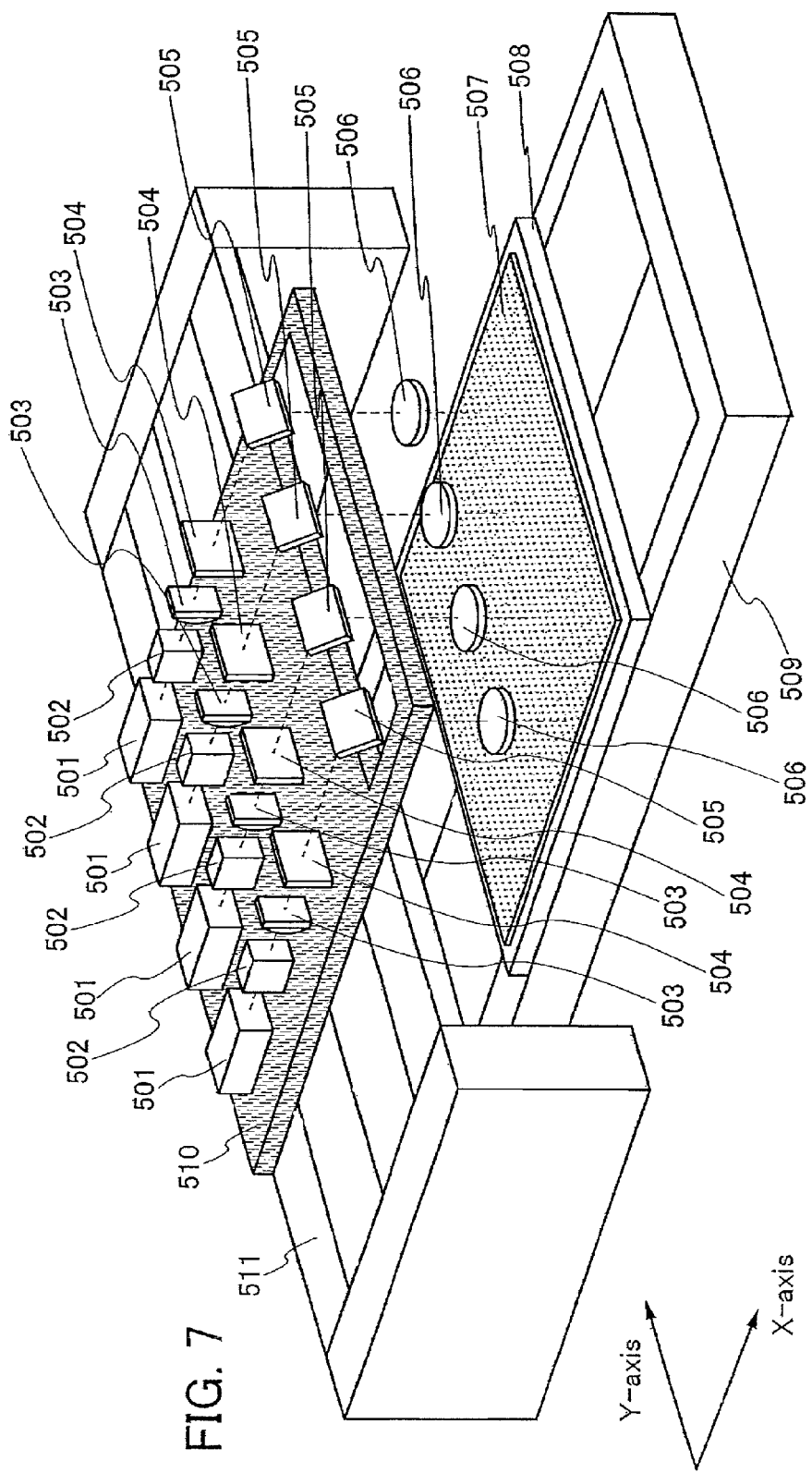

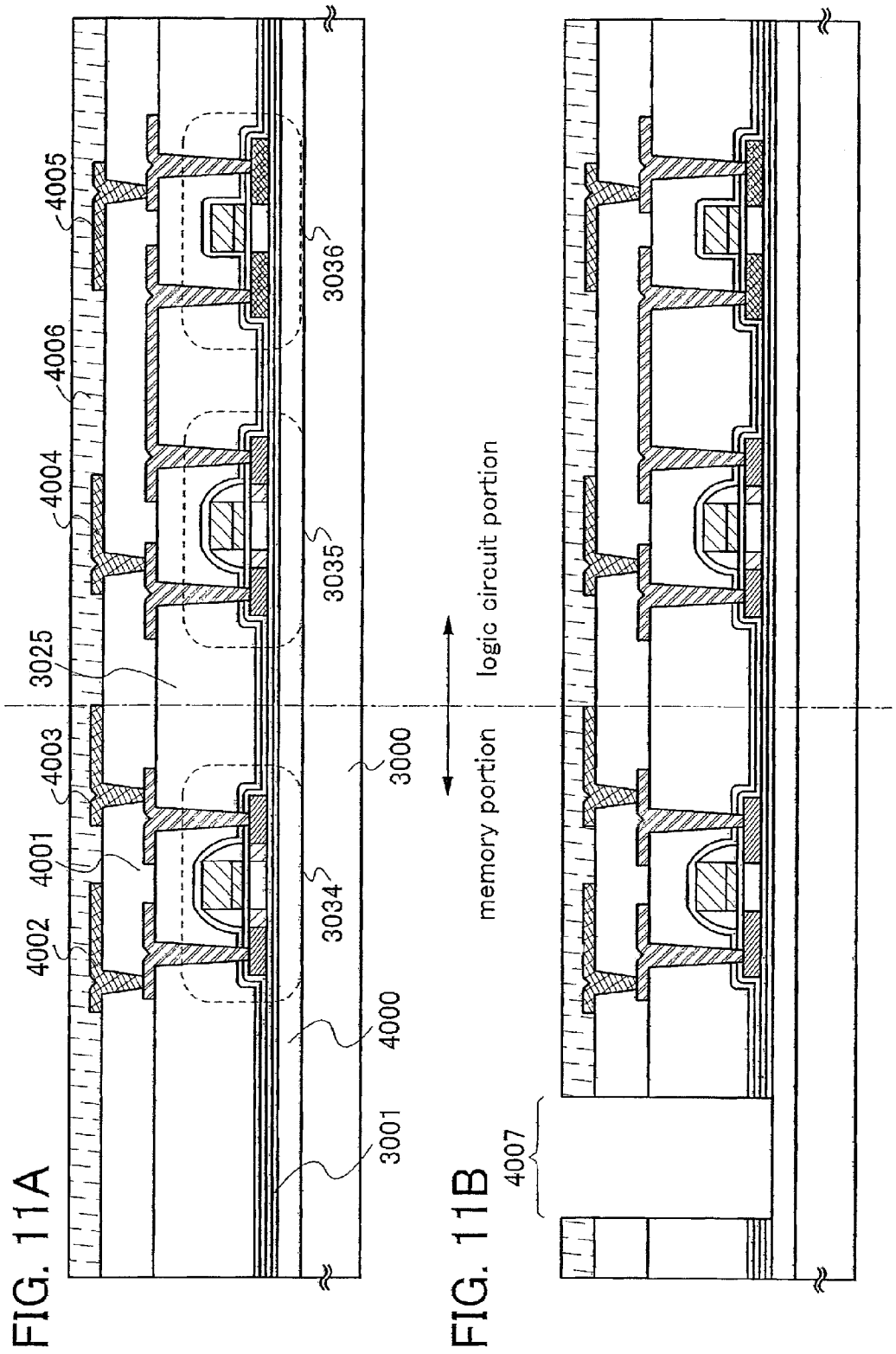

MANUFACTURING METHOD OF MEMORY ELEMENT, LASER IRRADIATION APPARATUS, AND LASER IRRADIATION METHOD

TECHNICAL FIELD

The present invention relates to a laser irradiation apparatus for efficiently performing laser irradiation which is performed by a laser direct drawing method or the like and a laser irradiation method. In addition, the present invention relates to a manufacturing method of a memory element including the laser irradiation step.

BACKGROUND ART

In a manufacturing process of a semiconductor, a manufacturing process of a printed wiring board, or the like, microfabrication is required due to the integration of a circuit. In general, a photomask where a circuit pattern is written is manufactured beforehand and a laser light-exposure technique for transferring the pattern to a substrate is used to perform such microfabrication. However, with a method of using a photomask, it takes cost and time to manufacture a mask. Therefore, in recent years, a mask-less process has drawn attention. There is a laser direct drawing method as a typical mask-less process. By the laser direct drawing method, a photosensitive material is discharged onto a conductive film that is formed by sputtering or the like or the upper surface of the conductive film is coated with the photosensitive material, and laser beam irradiation is performed thereover with the use of a laser beam direct drawing apparatus. At that time, the laser beam irradiation is performed selectively and development is further performed to form a mask in a region where the laser beam irradiation is performed. Next, etching of the conductive film with the use of this mask enables the conductive film to be processed into a desired pattern. Accordingly, a circuit pattern of a TFT (thin film transistor) and IC can be manufactured.

In a case where laser irradiation is performed by one laser beam at the time of performing the treatment by a laser direct drawing method, a region that can be processed at a time is limited to one place. Therefore, in a case where it is desired to rapidly perform laser process of a plurality of irradiation points, it is necessary to divide the laser beam into a plurality of beams. As a technique for dividing a laser beam into a plurality of beams and performing laser irradiation, for example, such a laser processing apparatus that has been proposed to divide a laser beam into a plurality of beam spots and perform irradiation with the use of a diffractive optical element (for example, see Patent Document 1: Japanese Published Patent Application No. 2002-228818).

DISCLOSURE OF INVENTION

In recent years, introduction of an ID chip referred to as an RFID (Radio Frequency Identification) has been considered in an industrial world. Since the ID chip can obtain information attached to an object without contact, a product is easily managed. For example, in performing process management or stock management in a production line, it is unnecessary to perform a work of scanning each of bar codes like in a conventional case. In addition, theft and forgery of a product can be prevented because traceability can be realized in a distribution system. The ID chip has a wide application range besides these and can be applied as a chip for individual identification of various objects.

In a case of manufacturing the ID chip, it is necessary to allocate an ID that is unique to each chip. ID is manufactured by store of information in a ROM (Read Only Memory). The ROM is one kind of a nonvolatile memory, where data is stored with physical change. As a storing method of data, there is a method referred to as "contact writing", whereby a piece of binary information of "0" or "1" is determined depending on whether a transistor is connected to a bit line; a method referred to as "ion writing", whereby a required threshold voltage (a voltage at which a switch of a MOS transistor can be turned on) Vt of a memory transistor is changed by ion implantation; or the like. Hereinafter, in this specification, a case of storing data by contact writing will be explained.

In a case of manufacturing a ROM by a laser direct drawing method, since circuit patterns can be switched by change of laser irradiation patterns, a ROM having desired information can be manufactured. Here, in a case of manufacturing an ID of an ID chip, where, for example, a memory capacitor of a ROM is regarded as N bits (N>1), $2^N$ laser irradiation patterns can be employed. For example, in a case of 256 bits, $2^{256}$ IDs can be manufactured by change of the combination of laser irradiation patterns. In the case where it is desired to perform laser irradiation with various patterns in such a manner, in the laser processing apparatus of Patent Document 1, it has been difficult to allocate an ID for each ROM because there is no function of isolating each irradiation pattern. Naturally, it is necessary to separately use a mask in order to allocate various IDs even in a conventional mask light-exposure process; therefore, it is not a realistic process in a semiconductor manufacturing process where real mass production is assumed.

In addition, in a case of manufacturing such an N-bits ROM, laser irradiation is to be performed in N places. Therefore, for example, in consideration of a case of manufacturing a chip with several mm square over a 600×720 mm sized glass substrate to perform mass production of an ID chip, it is necessary to perform laser irradiation in several millions to several ten millions positions per one substrate. In the case of performing such a large amount of laser irradiation, it is essential to speed up the process, and as for this, it cannot be said that the method according to Patent Document 1 is sufficient. Accordingly, such a device that can efficiently perform laser light-exposure on a substrate by rapid switching of a laser irradiation pattern has been required.

In view of the above problems, the present invention provides a laser irradiation apparatus for rapidly performing laser irradiation in a desired position as laser irradiation patterns are switched and a laser irradiation method. In addition, the present invention provides a manufacturing method of a memory element including the laser irradiation method.

According to one feature of the present invention, a method for manufacturing a memory element includes the steps of forming a plurality of island-shaped semiconductor layers having a source electrode or a drain electrode over a substrate; forming a first interlayer insulating film over the plurality of island-shaped semiconductor layers; forming a gate electrode over each of the plurality of island-shaped semiconductor layers with the first interlayer insulating film interposed therebetween; forming a second interlayer insulating film over the gate electrodes; providing a resist over the second interlayer insulating film; having the resist irradiated with a laser beam which is made to diverge into a plurality of laser beams by passing through a deflector and a diffractive optical element; and etching the first interlayer insulating film and the second interlayer insulating film by development of the resist irradiated with the laser beams to selectively form contact holes.

According to another feature of the present invention, a method for manufacturing a memory element includes the steps of forming a plurality of island-shaped semiconductor layers having a source electrode or a drain electrode over a substrate; forming a first interlayer insulating film over the plurality of island-shaped semiconductor layers; forming a gate electrode over each of the plurality of island-shaped semiconductor layers with the first interlayer insulating film interposed therebetween; forming a second interlayer insulating film over the gate electrodes; providing a resist over the second interlayer insulating film; having the resist irradiated with a plurality of laser beams each of which is made to diverge into a plurality of laser beams by passing through a deflector and a diffractive optical element which are each different; and etching the first interlayer insulating film and the second interlayer insulating film by development of the resist irradiated with the laser beams to selectively form contact holes.

According to another feature of the present invention, a laser irradiation apparatus includes a laser oscillator for emitting a laser beam; a deflector for performing deflection of the laser beam; a diffractive optical element for diverging a laser beam which has passed through the deflector into a plurality of laser beams; and a transport stage for mounting an irradiated object which is irradiated with the laser beam which is made to diverge into the plurality of laser beams.

According to another feature of the present invention, a laser irradiation apparatus includes a plurality of laser oscillators for emitting laser beams; a plurality of deflectors for performing deflection of the laser beams; a diffractive optical element for diverging one laser beam which has passed through the plurality of deflectors into a plurality of laser beams; and a transport stage for mounting an irradiated object which is irradiated with the laser beams each of which is made to diverge into the plurality of laser beams.

In such a laser irradiation apparatus, the deflector is preferably an acousto-optic deflector or a galvanometer mirror.

In such a laser irradiation apparatus, the diffractive optical element is preferably a transmission-type diffractive optical element or a reflection-type diffractive optical element.

According to another feature of the present invention, a laser irradiation method includes the steps of entering a laser beam emitted from a laser oscillator into a deflector; entering a laser beam which has passed through the deflector into a diffiactive optical element to diverge into a plurality of laser beams; and irradiating an above surface of an irradiated object with the laser beam which is made to diverge into the plurality of laser beams.

According to another feature of the present invention, a laser irradiation method includes the steps of entering each of laser beams emitted from a plurality of laser oscillators into a plurality of different deflectors; entering each of laser beams which has passed through the deflectors into a plurality of different diffractive optical elements to diverge one of the laser beams into a plurality of laser beams by passing through the diffractive optical elements; and irradiating an above surface of an irradiated object with the laser beam which is made to diverge into the plurality of laser beams.

In such a laser irradiation method, the above surface of the irradiated object is irradiated with the laser beam, which is made to diverge into the plurality of laser beams, after passing through a projection lens.

According to another feature of the present invention, a laser irradiation method includes the steps of entering a laser beam emitted from a laser oscillator into a deflector; entering a laser beam which has passed through the deflector into a diffractive optical element to be diverged into a plurality of laser beams; and irradiating a photoresist formed over an insulating film with the laser beam which is made to diverge into the plurality of laser beams.

According to this laser irradiation method, the photoresist irradiated with the laser beam may be developed and the insulating film may be etched so as to selectively form contact holes.

In this laser irradiation method, the above surface of the insulating film may be irradiated with the laser beam, which is made to diverge into the plurality of laser beams, after passing through a projection lens.

In this laser irradiation method, a transmission-type diffractive optical element or a reflection-type diffractive optical element is preferably used as the diffractive optical element.

In the present invention, with the use of a diffractive optical element and a deflector in combination, laser irradiation can be performed as various irradiation patterns are switched. In addition, a plurality of beam spots can be formed at a time and laser beam irradiation can be performed efficiently. Further, since a traveling direction of a laser beam can be controlled rapidly, laser irradiation can be performed efficiently when it is necessary to perform laser process for a complicated or plurality of irradiation points. Therefore, with the application of the laser irradiation apparatus of the present invention to a laser direct drawing process over a semiconductor film, data can be easily stored in a ROM and the productivity can be improved.

BRIEF DESCRIPTION OF DRAWINGS

In the accompanying drawings:

FIG. 2 is a view showing a laser irradiation pattern;

FIG. 7 is a view showing a structure of a laser irradiation apparatus;

FIGS. 11A and 11B are views each showing a manufacturing process of a semiconductor device;

BEST MODE FOR CARRYING OUT THE INVENTION

Figure 1A:
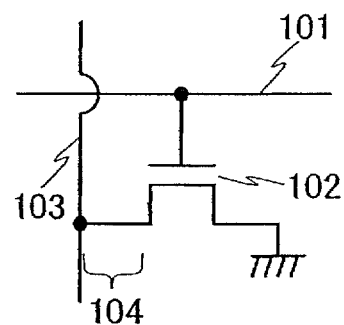
FIGS. 1A and 1B are diagrams each showing a circuit configuration of a memory cell.

Embodiment modes of the present invention will be explained hereinafter with reference to the accompanying drawings. However, it is to be easily understood that various changes and modifications will be apparent to those skilled in the art. Therefore, unless such changes and modifications depart from the purpose and the scope of the present invention, they should be construed as being included therein. Note that the same portions or portions having the same function in all figures for explaining embodiment modes are denoted by the same reference numerals and detailed explanations thereof will be omitted.

Embodiment Mode 1

This embodiment mode will explain a structure of an apparatus for rapidly performing laser irradiation in a desired position as laser irradiation patterns are switched and a laser irradiation method with reference to FIGS. 1A and 1B, FIG. 2, FIG. 3, and FIG. 4.

Figure 1B:
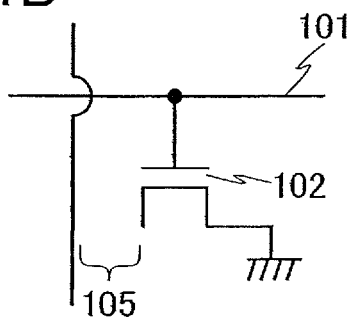

In a case of manufacturing a ROM, information is stored by change of a wiring method of a transistor in order to distinguish pieces of binary information of "0" and "1". FIGS. 1A and 1B each show an example of a circuit configuration of a memory cell where contact writing is performed. FIG. 1A is a circuit configuration for holding "0" of the pieces of binary information. In this configuration, a transistor 102 is connected to a word line 101 for driving the memory cell and a bit line 103. Here, the connection to the bit line is performed by a wiring formed in a region 104. On the other hand, FIG. 1B is a circuit configuration for holding "1" of the pieces of the binary information. In this configuration, a transistor 102 is not connected to a bit line. In a region 105, where laser irradiation is performed by a laser direct drawing method, a wiring is removed. The circuit configurations and dispositions of the above memory cells are each determined by a laser irradiation pattern by a laser direct drawing method.

Here, FIG. 2 shows an example of a laser irradiation pattern in a 256-bit ROM. FIG. 2 has 256-number memory cells 201, which are disposed in a structure of 16 columns thereof in a region 203 of a horizontal direction and 16 columns thereof in a region 204 of a longitudinal direction. Dots 202 shown in circles with shaded area are regions irradiated with a laser beam. One place of each memory cell is irradiated with the laser beam. In a case where each of the upper sides of the memory cells 201 in FIG. 2 is irradiated with the laser beam, a wiring is removed in the region irradiated with the laser beam, where the circuit of FIG. 1B is formed. On the other hand, in a case where each of the lower sides of the memory cells 201 in FIG. 2 is irradiated with the laser beam, a circuit corresponding to FIG. 1A is formed. Note that each region on the lower sides of the memory cells 201 in FIG. 2 is a dummy region, where a conductive film does not exist. Therefore, in this structure, the circuit configuration of the memory cells is not affected even when this portion is irradiated with the laser beam.

Figure 3:
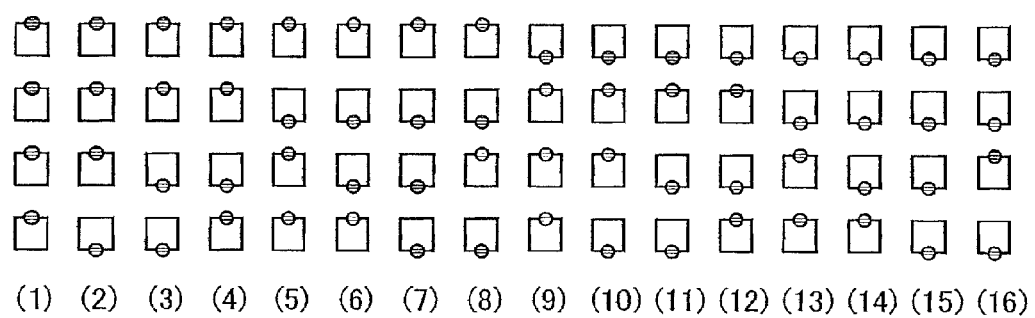
FIG. 3 is a view showing a laser irradiation pattern.

In such a manner, although the memory cells can be manufactured by distinction of pieces of binary information in accordance with laser irradiation positions, a function that can write the irradiation patterns of the laser beam into $2^{256}$ patterns is necessary in a case of manufacturing a 256-bit ROM. However, since it is difficult to form such patterns at a time, parts of the 256 memory cells are considered as irradiation units, and laser irradiation is performed in each unit in this embodiment mode. For example, in a case of considering U-number memory cells (U>1) as one unit, all laser beam irradiation patterns which are possible can be formed as long as the irradiation patterns can be switched into $2^U$ patterns in the unit. As an example, FIG. 3 shows $2^4$ specific irradiation patterns when four memory cells are considered as one unit. Such irradiation patterns are switched every unit to perform laser irradiation; therefore, the laser irradiation can be performed at a desired position of all memory cells that constitute a ROM. Note that, in manufacturing one ROM ($X_B$ bit), the number of switching the above irradiation patterns is $X_B/U$.

Figure 4:
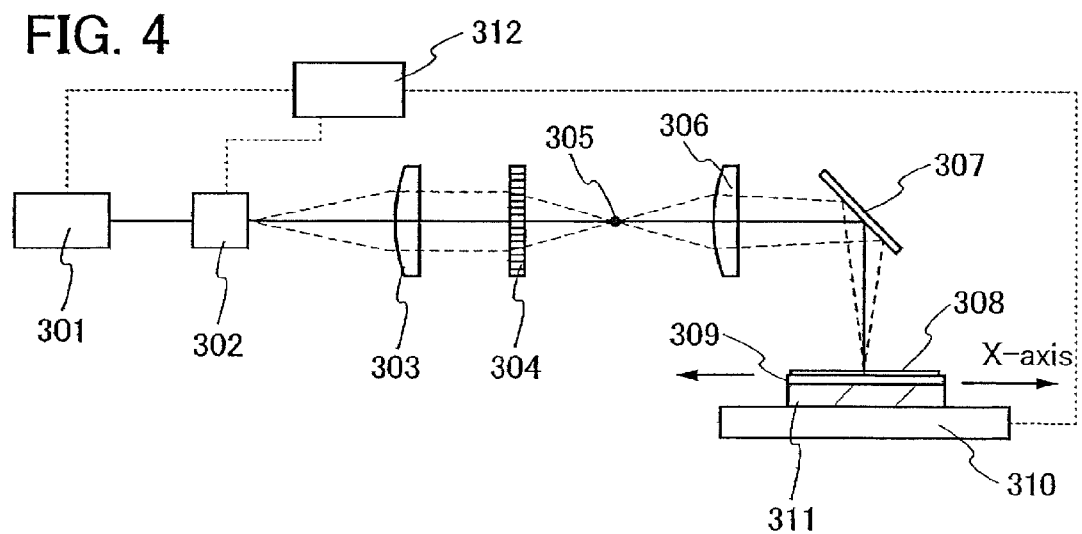
FIG. 4 is a view showing a structure of a laser irradiation apparatus.

Next, a specific laser irradiation method will be explained with reference to FIG. 4. FIG. 4 shows a block diagram of a laser irradiation apparatus in this embodiment mode. First, a laser beam emitted from a laser oscillator 301 passes through a deflector 302. This embodiment mode will show an example where an AOD (Acousto-Optical Deflector) is used as the deflector 302. Note that the deflector that is used in the present invention is not limited to an AOD. For example, a galvanometer mirror may be used to control the traveling direction of the laser beam. An AOD is a deflector for deflecting a laser beam by an acoustooptic effect in an optical medium. A deflection angle θ at this time is expressed by the following equation (1).

[EQUATION 1]

$$\theta = \lambda f_a / V_a \quad (1)$$

Here, λ denotes a wavelength of a laser beam; $f_a$, an acoustic wave frequency; and $V_a$, an acoustic wave speed. Note that an optical medium is appropriately selected depending on a wavelength, a deflection direction, a laser power, or the like of a laser beam. For example, in a visible region, a material such as gallium phosphorus, tellurium dioxide, or indium phosphorus can be used as the optical medium. A laser beam that is deflected at a deflection angle in proportion to an acoustic wave frequency enters a collimating lens 303. The focal length of the collimating lens 303 is regarded as $f_c$, and the collimating lens 303 is disposed at a point that is apart from the AOD by $f_c$. Accordingly, the laser beam that has passed through the collimating lens 303 does not depend on the deflection angle of the AOD but all travels in a direction parallel to an optic axis. Note that the collimating lens 303 is used here to facilitate a design of a diffractive optical element by control of the traveling direction of the laser beam to increase the diffraction efficiency. Therefore, it is not always necessary to use the collimating lens 303 in a case where it is possible to design such a diffractive optical element that can obtain a diffraction efficiency or a beam characteristic which is high enough for a light-exposure process.

Further, the laser beam is made to enter a transmission type diffractive optical element 304. Note that the diffractive optical element that is used here does not control light by refraction or reflection but control the behavior of the laser beam by a diffraction phenomenon of the planar structure. The diffractive optical element is designed by an ORA (Optimal Rotation Angle) method or the like to optimize phase distribution. In addition, it is also possible to automatically design the diffractive optical element with optical design software whereby wave optical analysis can be performed. As a physical shape of the diffractive optical element, a binary phase grating, a multiple phase grating, a consecutive phase grating, or the like can be applied. The transmission type diffractive optical element 304 is designed to have a function that the laser beam is made to diverge. Divergence patterns thereof can be manufactured as shown in FIG. 3, for example. 16 patterns each denoted by (1) to (16) of FIG. 3 show combinations of irradiation position of four laser beams. 16 kinds of diffractive optical elements that can form these patterns are manufactured. 16 kinds of diffractive optical elements that are further manufactured are stacked to be overlapped so that the laser beam deflected by the AOD are made to enter any of the 16 kinds of diffractive optical elements.

In addition, all of laser beams which are made to diverge by the diffractive optical element are designed so as to converge at a region denoted by reference numeral 305 in FIG. 4. In this embodiment mode, a plurality of beam spots that are made to converge at the region 305 are formed to arrange in a direction vertical to paper. Then, laser beams that have passed through the region 305 enter a projection lens 306. The projection lens 306 is provided to project the beam spots that are formed at the region 305 on an irradiated surface. The region 305 and the irradiated surface are in a conjugation relation with each other by the projection leans 306. in a case where a distance from the region 305 to the projection lens 306 is regarded as a; a distance from the projection lens 306 to the irradiated surface, b; and a focal length of the projection lens 306, f, a conjugation equation of an equation (2) is formed.

[EQUATION 2]

$$1/f = 1/a + 1/b \quad (2)$$

Note that the projection lens 306 is provided by transfer of the beam spots formed at the region 305 to the irradiated surface so as to enable reduced projection or the like of the beam spot and minuter processing at the irradiated surface. Therefore, it is not always necessary to provide the projection lens 306 in a case where a desired beam spot is formed at the region 305. Traveling directions of laser beams that have passed through the projection lens 306 are deflected in the direction of the irradiated surface by a mirror 307. Over a substrate 308, which is the irradiated surface, a semiconductor film, a conductive film, a resist layer, and the like are stacked. The substrate 308 is irradiated with laser beams by the above optical system. The patterns of the laser beams with which the substrate is irradiated are formed depending on each pattern of the diffractive optical elements that constitute the transmission-type diffractive optical element 304. The substrate 308 is sucked on a suction stage 309, and the suction stage 309 is transported along an X-axis in FIG. 4 by a transport stage 310. The transport speed at this time may be appropriately determined depending on a desired space of the laser irradiation patterns. For example, in a case where it is desired to perform laser irradiation with a space of $D_X$ (μm) in the X-axis direction, where a repetition rate of a pulse laser oscillator is regarded as H (Hz), a transport speed $V_X$ (m/sec) of the transport stage 310 can be determined by the following equation (3).

[EQUATION 3]

$$V_X = D_X \times H \times 10^{-6} \quad (3)$$

For example, in a case of performing laser irradiation with a space of 100 μm in the X-axis direction with the use of a laser having a repetition rate of 1 kHz, the transport speed may be 10 cm/sec. After scanning in the X-axis direction is completed, the substrate is moved in a Y-axis direction (a direction vertical to paper in FIG. 4) with a transport stage 311. After the movement in the Y-axis direction is completed to a desired position, laser irradiation is performed as the transport stage 310 is moved again in the X-axis direction.

Note that, in a case of performing laser irradiation by change of the deflection angle of the AOD every pulse with the use of a pulsed oscillation laser for the laser oscillator 301, it is necessary to completely synchronize a repetition interval of the laser oscillator 301 and a deflection cycle of the AOD. In addition, in order to perform laser irradiation after positioning is performed precisely in a plane of the substrate, the laser oscillator 301 and the AOD have to be operated along with the movement of the transport stage 310 or 311. In this case, the operation and movement may be controlled by a computer 312. Specifically, an encoder that can confirm the position is attached to the transport stages 310 and 311, and positioning information from the encoder is grasped by the computer 312. Further, at the time when the transport stage 310 or 311 reaches a desired position, an operation signal is output to the laser oscillator 301. The laser oscillator 301 is provided with an inside shutter, which is opened at the moment of receive of the operation signal to start laser irradiation. In addition, in the computer 312, the irradiation pattern of the irradiation units that are arranged in the X-axis direction is read in advance from the memory that has stored the laser irradiation patterns in the plane of the substrate. The deflection angle of the AOD is controlled in the order of this read pattern at the time of the movement of the transport stage 310 in the X-axis direction and oscillation of the laser oscillator 301. In order to synchronize the operations of the laser oscillator 301 and the AOD, a trigger signal that is generated from the laser oscillator in a laser repetition cycle may be monitored, and the AOD may be operated in accordance with this signal. Moreover, it may be possible to employ such a structure in which part of the laser beam emitted from the laser oscillator is monitored with a photoelectric element or the like and the AOD is operated so as to be synchronized with an electrical signal that is generated from the trigger signal. Note that the example of irradiating one irradiation pattern with one laser pulse is shown here; however, the structure of the laser irradiation apparatus of the present invention is not limited thereto. For example, a structure where a plurality of laser pulses are overlapped every one laser irradiation pattern to perform irradiation may be employed in such a case where laser irradiation is performed to a material having inferior photosensitivity. According to the above structure, it becomes possible to perform a light-exposure process with a method which is optimum for a photosensitive material.

By the laser irradiation with the above methods, the laser irradiation patterns can be switched rapidly so that the laser irradiation can be performed efficiently on the substrate. Since a light-exposure process can be performed by irradiation of laser beams of a plurality of patterns in the laser irradiation apparatus of the present invention, productivity can be increased by application of the laser irradiation apparatus of the present invention to a manufacturing process of a product, where a pattern that is exposed to light is frequently changed, like a ROM. For example, with application of the laser irradiation apparatus of the present invention to a manufacturing process of a ROM of an ID chip or the like, mass production of an ID having a plurality of patterns can be realized at low cost.

Embodiment Mode 2

This embodiment mode will explain a laser irradiation apparatus by division of a laser beam with the use of a reflection-type diffractive optical element and a laser irradiation method.

Figure 5:
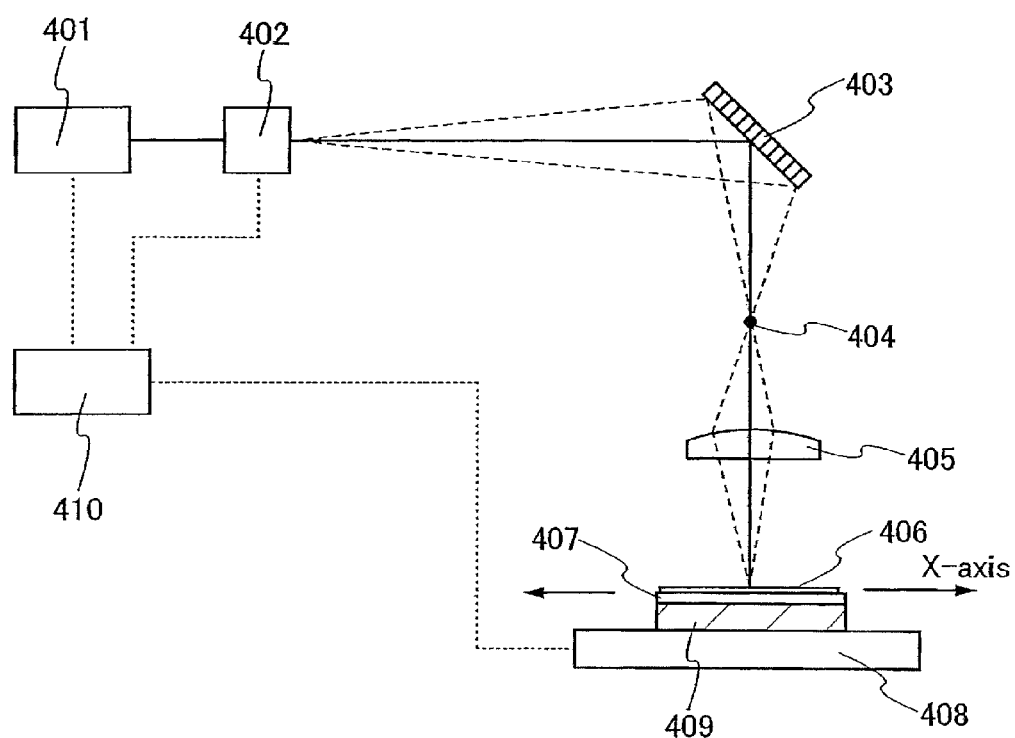
FIG. 5 is a view showing a structure of a laser irradiation apparatus.
Figure 6A:
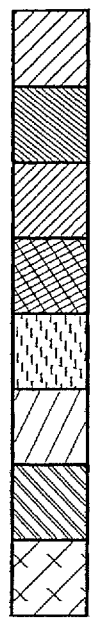
FIGS. 6A and 6B are views each showing a divergence pattern of a diffractive optical element.
Figure 6B:
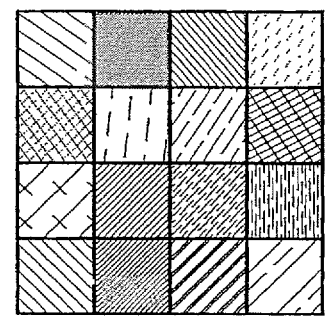

FIG. 5 shows a block diagram of a laser irradiation apparatus of this embodiment mode. A laser beam emitted from a laser oscillator 401 passes through a deflector 402. This embodiment mode will show an example where an AOD (Acousto-Optical Deflector) is used as the deflector 402. Note that the deflector that is used in the present invention is not limited to an AOD. For example, a galvanometer mirror may be used to control the traveling direction of the laser beam. An AOD is a deflector for deflecting a laser beam by an acoustooptic effect in an optical medium. A laser beam that is deflected at a deflection angle in proportion to an acoustic wave frequency added to the AOD enters a reflection-type diffractive optical element 403. The reflection-type diffractive optical element 403 is designed to have a function that the laser beam is deflected in a substrate direction and is made to diverge. In a case where the number of laser beams with which irradiation is performed at a time is regarded as U, $2^U$ divergence patterns thereof are necessary. Thus, diffractive optical elements depending on each of the divergence patterns are manufactured. Further, as shown in FIG. 6A, the diffractive optical elements depending on each of the divergence patterns are stacked to form the reflection-type diffractive optical element 403. Note that the structure of the reflection-type diffractive optical element 403 that is used in the present invention is not limited thereto. For example, the traveling direction of the laser beams may be controlled two-dimensionally with the use of a galvanometer mirror or the like that is provided between the AOD and the reflection-type diffractive optical element 403 so that the laser beam enters diffractive optical elements having different divergence patterns which are disposed in a grid-like arrangement as shown in FIG. 6B. The laser beam deflected by the AOD is made to enter any of diffractive optical elements that form each pattern. In addition, all of laser beams which are made to diverge by the reflection-type diffractive optical element are designed so as to converge at a region 404 in FIG. 5. In this embodiment mode, a plurality of beam spots that are made to converge at the region 404 are formed to arrange in a direction vertical to paper. Then, laser beams that have passed through the region 404 enter a projection lens 405. The projection lens 405 is provided to project the beam spots that are formed at the region 404 on an irradiated surface. The region 404 and the irradiated surface are in a conjugation relation with each other by the projection leans 405. In a case where a distance from the region 404 to the projection lens 405 is regarded as a; a distance from the projection lens 405 to the irradiated surface, b; and a focal length of the projection lens 405, f, a conjugation equation of an equation (4) is formed.

[EQUATION 4]

$$1/f = 1/a + 1/b \tag{4}$$

Note that the projection lens 405 is provided by transfer of the beam spots formed at the region 404 to the irradiated surface so as to enable reduced projection or the like of the beam spot and minuter processing at the irradiated surface. Therefore, it is not always necessary to provide the projection lens 405 in a case where a desired beam spot is formed at the region 404. A substrate 406, which is the irradiated surface, is irradiated with the laser beams that have passed through the projection lens 405. Over the substrate 406, a semiconductor film, a conductive film, a resist layer, and the like are stacked. The patterns of the laser beams with which the substrate is irradiated are formed depending on each pattern of the diffractive optical elements that constitute the reflection-type diffractive optical element 403. The substrate 406 is sucked on a suction stage 407, and the suction stage 407 is transported along an X-axis in FIG. 5 by a transport stage 408. The transport speed at this time may be appropriately determined depending on a desired space of the laser irradiation patterns. For example, in a case where it is desired to perform laser irradiation with a space of $D_X$ (μm) in the X-axis direction, where a repetition rate of a pulse laser oscillator is regarded as H (Hz), a transport speed $V_X$ (m/sec) of the transport stage 408 can be determined by the following equation (5).

[EQUATION 5]

$$V_X = D_X \times H \times 10^{-6} \tag{5}$$

For example, in a case of performing laser irradiation with a space of 100 μm in the X-axis direction with the use of a laser having a repetition rate of 1 kHz, the transport speed may be 10 cm/sec. After scanning in the X-axis direction is completed, the substrate is moved in a Y-axis direction (a direction vertical to paper in FIG. 5) with a transport stage 409. After the movement in the Y-axis direction is completed to a desired position, laser irradiation is performed as the transport stage 408 is moved again in the X-axis direction.

Note that, in a case of performing laser irradiation by change of the deflection angle of the AOD every pulse with the use of a pulsed oscillation laser for the laser oscillator 401, it is necessary to completely synchronize a repetition interval of the laser oscillator 401 and a deflection cycle of the AOD. In addition, in order to perform laser irradiation after positioning is performed precisely in a plane of the substrate, the laser oscillator 401 and the AOD have to be operated along with the movement of the transport stage 408 or 409. In this case, the operation and movement may be controlled by a computer 410. Specifically, an encoder that can confirm the position is attached to the transport stages 408 and 409, and positioning information from the encoder is grasped by the computer 410. Further, at the time when the transport stage 408 or 409 reaches a desired position, an operation signal is output to the laser oscillator 401. The laser oscillator 401 is provided with an inside shutter, which is opened at the moment of receive of the operation signal to start laser irradiation. In addition, in the computer 410, the irradiation pattern of irradiation units that are arranged in the X-axis direction is read in advance from the memory that has stored the laser irradiation patterns in the plane of the substrate. The deflection angle of the AOD is controlled in the order of this read pattern at the time of the movement of the transport stage 408 in the X-axis direction and oscillation of the laser oscillator 401. In order to synchronize the operations of the laser oscillator 401 and the AOD, a trigger signal that is generated from the laser oscillator in a laser repetition cycle may be monitored, and the AOD may be operated in accordance with this signal. Moreover, it may be possible to employ such a structure in which part of the laser beam emitted from the laser oscillator is monitored with a photoelectric element or the like and the AOD is operated so as to be synchronized with an electrical signal that is generated from the trigger signal. Note that the example of irradiating one irradiation pattern with one laser pulse is shown here; however, the structure of the laser irradiation apparatus of the present invention is not limited thereto. For example, a structure where a plurality of laser pulses are overlapped every one laser irradiation pattern to perform irradiation may be employed in such a case where laser irradiation is performed to a material having inferior photosensitivity. According to the above structure, it becomes possible to perform a light-exposure process with a method which is optimum for a photosensitive material.

By the laser irradiation with the above methods, the laser irradiation patterns can be switched rapidly so that the laser irradiation can be performed efficiently on the substrate. Since a light-exposure process can be performed by irradiation of laser beams to a plurality of patterns in the laser irradiation apparatus of the present invention, productivity can be increased by application of the laser irradiation apparatus of the present invention to a manufacturing process of a product, where a pattern that is exposed to light is frequently changed, like a ROM. For example, with application of the laser irradiation apparatus of the present invention to a manufacturing process of a ROM of an ID chip or the like, mass production of an ID having a plurality of patterns can be realized at low cost.

Embodiment Mode 3

This embodiment mode will explain a laser irradiation apparatus, where a plurality of optical systems that can form various irradiation patterns is disposed so that a plurality of irradiation points can be irradiated efficiently with laser beams, and a laser irradiation method.

FIG. 7 shows a perspective view of a laser irradiation apparatus of this embodiment mode. In the laser irradiation apparatus shown in FIG. 7, four sets of optical systems are provided on an element mounting base 510. In this embodiment mode, a set of optical systems includes a laser oscillator 501, a deflector 502, a collimating lens 503, a transmission type diffractive optical element 504, a mirror 505, and a projection lens 506. A laser beam emitted from the laser oscillator 501 passes through the deflector 502. This embodiment mode will show an example where an AOD (Acousto-Optical Deflector) is used as the deflector 502. Note that the deflector that is used in the present invention is not limited to an AOD. For example, a galvanometer mirror may be used to control the traveling direction of the laser beam. An AOD is a deflector for deflecting a laser beam by an acoustooptic effect in an optical medium.

Next, a laser beam that is deflected at a deflection angle in proportion to an acoustic wave frequency added to the AOD enters the collimating lens 503. The focal length of the collimating lens 503 is regarded as $f_c$, and the collimating lens 503 is disposed at a point that is apart from the AOD by $f_c$. Accordingly, the laser beams that have passed through the collimating lens 503 do not depend on the deflection angle of the AOD but all travel in a direction parallel to an optic axis. Note that the collimating lens 503 is used here to facilitate a design of a diffractive optical element by control of the traveling direction of the laser beam so as to increase the diffraction efficiency. Therefore, it is not always necessary to use the collimating lens 503 in a case where it is possible to design such a diffractive optical element that can obtain a diffraction efficiency or a beam characteristic which is high enough for a light-exposure process.

Further, the laser beam enters the transmission-type diffractive optical element 504. The transmission-type diffractive optical element 504 is designed to have a function that the laser beam is made to diverge. In a case where the number of laser beams with which irradiation is performed at a time is regarded as U, $2^U$ divergence patterns thereof are necessary. Thus, diffractive optical elements depending on each of the divergence patterns are manufactured. Further, as shown in FIG. 6A, the diffractive optical elements depending on each of the divergence patterns are stacked to form the transmission-type diffractive optical element 504. Note that the structure of the transmission-type diffractive optical element 504 that is used in the present invention is not limited thereto. For example, the traveling direction of the laser beams may be controlled two-dimensionally with the use of a galvanometer mirror or the like that is provided between the AOD and the transmission-type diffractive optical element 504 so that the laser beam enters diffractive optical elements having different divergence patterns which are disposed in a grid-like arrangement as shown in FIG. 6B.

Here, the laser beam deflected by the AOD is made to enter any of diffractive optical elements that form each pattern. Four laser beams emitted from the four laser oscillators 501 each enter any of the four transmission-type diffractive optical elements 504. Then, each laser beam passes through the transmission-type diffractive optical element 504, thereby being made to diverge into a plurality of laser beams. In other words, the laser beams emitted from the plurality of laser oscillators are each made to enter a different deflector, and the laser beams that have passed through the deflectors are each made to enter a different transmission-type diffractive optical element. Therefore, the laser beams each pass through the transmission-type diffractive optical element to be made to diverge into a plurality of laser beams.

In addition, a traveling direction of the laser beam that is made to diverge by the transmission-type diffractive optical element 504 is deflected by the mirror 505 in the direction of an irradiated surface. The laser beams deflected by the mirror 505 pass through the projection lens 506. The projection lens is used to obtain reduced projection of a beam spot formed by the transmission-type diffractive optical element 504 on a substrate 507 which is the irradiated surface. Accordingly, minute processing can be performed at the irradiated surface. Note that the above optical elements are disposed on the element mounting base 510. FIG. 7 shows the example where the four optical systems each having the same element structure are provided; however, the structures of the optical systems are not limited thereto.

With the use of the laser irradiation apparatus shown in FIG. 7, laser irradiation using a plurality of laser beams emitted from the four laser oscillators can be performed simultaneously on the same substrate so that throughput of the laser irradiation process can be improved. Note that the number of optical systems provided in the laser irradiation apparatus is not limited thereto. The number of optical elements may be appropriately determined in consideration of the element size included in the optical systems, desired mass productivity, or the like.

Over the substrate 507, a semiconductor film, a conductive film, a resist layer, and the like are stacked, and laser beam irradiation is performed by the above optical systems. The patterns of the laser beam irradiation, which is performed here, are formed depending on each pattern of the diffractive optical element that constitutes the transmission-type diffractive optical element 504. The substrate 507 is sucked on a suction stage 508, and the suction stage 508 is transported along an X-axis in FIG. 7 by a transport stage 509. The transport speed at this time may be appropriately determined depending on a desired space of the laser irradiation patterns. For example, in a case where it is desired to perform laser irradiation with a space of $D_X$ (μm) in the X-axis direction, where a repetition rate of a pulse laser oscillator is regarded as H (Hz), a transport speed $V_X$ (m/sec) of the transport stage 509 can be determined by the following equation (6).

[EQUATION 6]

$$V_X = D_X \times H \times 10^{-6} \qquad (6)$$

For example, in a case of performing laser irradiation with a space of 100 μm in the X-axis direction with the use of a laser having a repetition rate of 1 kHz, the transport speed may be 10 cm/sec. After scanning in the X-axis direction is completed, a transport stage 511 on which the element mounting base 510 is put is moved in a Y-axis direction. After the movement in the Y-axis direction is completed to a desired position, laser irradiation is performed as the transport stage 509 is moved again in the X-axis direction.

By the laser irradiation with the above methods, the laser irradiation patterns can be switched rapidly so that the laser irradiation can be performed efficiently on the substrate. In addition, a plurality of regions in the substrate can be processed simultaneously. Since a light-exposure process can be performed by irradiation of laser beams to a plurality of patterns in the laser irradiation apparatus of the present invention, productivity can be increased by application of the laser irradiation apparatus of the present invention to a manufacturing process of a product, where a pattern that is exposed to light is frequently changed, like a ROM. For example, with application of the laser irradiation apparatus of the present invention to a manufacturing process of a ROM of an ID chip or the like, mass production of an ID having a plurality of patterns can be realized at low cost.

Embodiment 1

Figure 8:
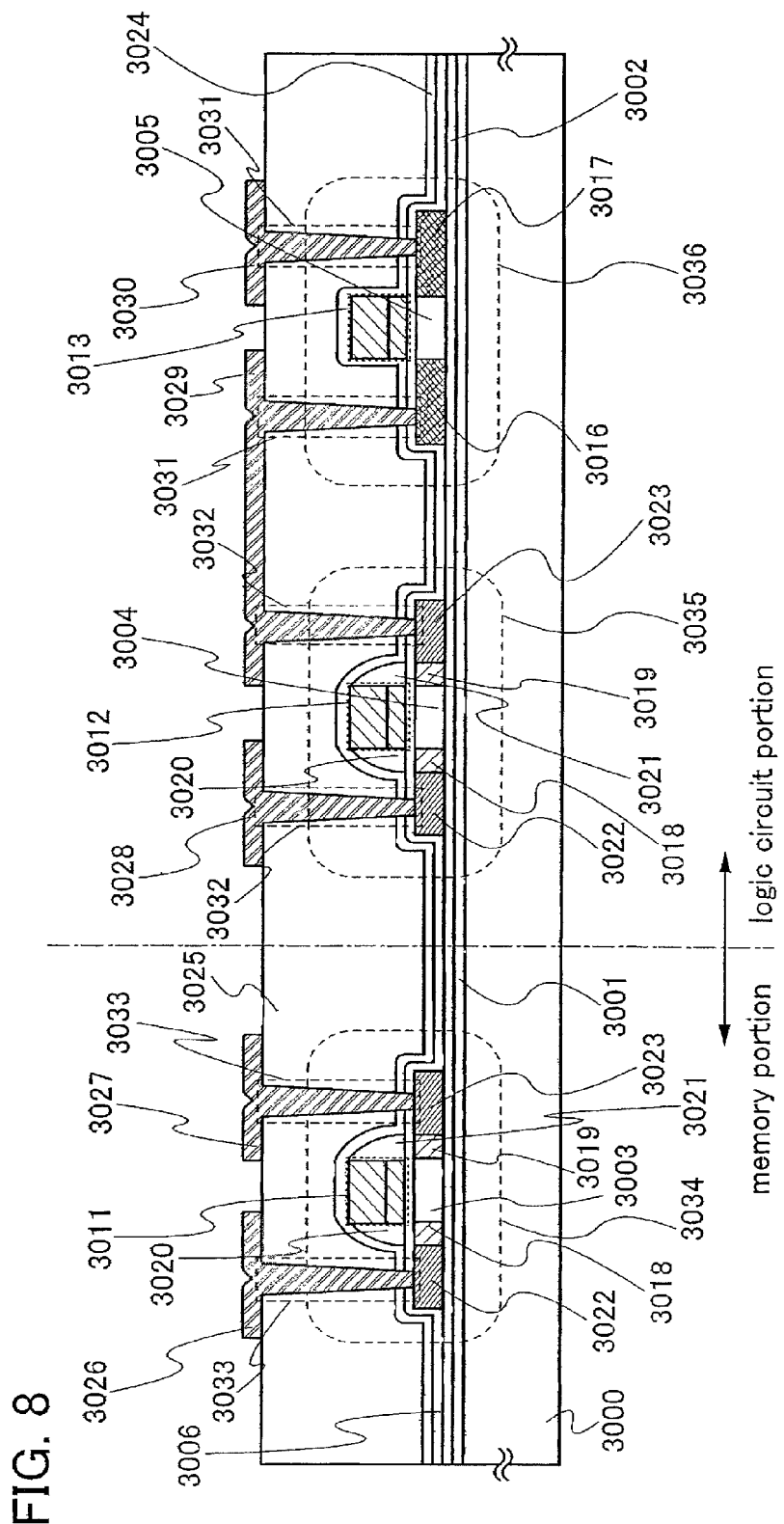
FIG. 8 is a view showing a cross section of a semiconductor device.

This embodiment will explain a method for manufacturing, over an insulating substrate, a semiconductor element, which is used for a nonvolatile memory circuit, a modulation circuit, a demodulation circuit, a logic circuit, or the like, with reference to FIG. 8. Note that this embodiment shows an n-channel thin film transistor (hereinafter, referred to as a TFT) and a p-channel TFT as examples of a semiconductor element; however, semiconductor elements included in a memory portion and a logic circuit portion in the present invention are not limited thereto. In addition, the manufacturing method that is shown in this embodiment is only an example and does not limit the manufacturing method of the semiconductor element over the insulating substrate.

First, base films 3001 and 3002 formed of an insulating film such as a silicon oxide film, a silicon nitride film, a silicon oxynitride film, or a silicon nitride oxide film over an insulating substrate 3000 which is a glass substrate 3000. For example, a silicon oxynitride film with a thickness of 10 to 200 nm and a hydrogenated silicon oxynitride film with a thickness of 50 to 200 nm are sequentially stacked as the base films 3001 and 3002, respectively.

Next, a semiconductor film having an amorphous structure is formed over the base film 3002, and the semiconductor film is crystallized by a laser crystallization method or a thermal crystallization method to form a crystalline semiconductor film. Then, the crystalline semiconductor film is processed to form island-shaped semiconductor layers 3003, 3004, and 3005. These island-shaped semiconductor layers 3003, 3004, and 3005 are each formed with a thickness of 25 to 80 nm. A material of the crystalline semiconductor film is not limited; however, silicon, a silicon-germanium (SiGe) alloy, or the like is preferably used.

Next, a gate insulating film 3006 is formed to cover the island-shaped semiconductor layers 3003, 3004, and 3005. The gate insulating film 3006 is formed of an insulating material containing silicon with a thickness of 10 to 80 nm by a plasma CVD method or a sputtering method.

Then, a first conductive layer is formed over the gate insulating film 3006. Subsequently, a second conductive layer is formed over the first conductive layer, and the stacked first conductive layer and second conductive layer are etched collectively to form gate electrodes 3011, 3012, and 3013 of TFTs.

In this embodiment, the first conductive layer is formed of TaN with a thickness of 50 to 100 nm, and the second conductive layer is formed of W with a thickness of 100 to 300 nm. However, a material of the conductive layers is not particularly limited, and any of an element of Ta, W, Ti, Mo, Al, and Cu, or an alloy material or a compound material containing the element as its main component may be used.

Next, doping of an element imparting p-type conductivity is performed to a p-channel TFT, which is used in the logic circuit portion, to form first impurity regions 3016 and 3017. Subsequently, in order to form LDD regions of n-channel TFTs which are used in the memory portion and the logic circuit portion, doping of an element imparting n-type conductivity is performed to form second impurity regions 3018 and 3019. Then, after sidewalls 3020 and 3021 are formed, doping of an element imparting n-type conductivity is performed to the n-channel TFTs, which are used in the memory portion and the logic circuit portion, to form third impurity regions 3022 and 3023. These doping methods may be performed by ion doping or ion implantation. Through the above steps, the impurity regions are formed in each of the island-shaped semiconductor layers 3003, 3004, and 3005.

Then, the impurity elements added to each of the island-shaped semiconductor layers 3003, 3004, and 3005 are activated. This step is performed by a thermal annealing method using an annealing furnace. Besides, a laser annealing method or a rapid thermal annealing (RTA) method can be applied. Subsequently, heat treatment at temperatures of 300 to 450° C. for 1 to 12 hours is performed in an atmosphere containing 3% or more of hydrogen to hydrogenate the island-shaped semiconductor layers. As other means for the hydrogenation, plasma hydrogenation (which uses hydrogen excited by plasma) may also be performed.

Next, a first interlayer insulating film 3024 is formed of a silicon oxynitride film with a thickness of 10 to 80 nm, which is nearly equal to the gate insulating film. Subsequently, a second interlayer insulating film 3025 is formed of an organic insulating material such as acrylic. Alternatively, as the second interlayer insulating film 3025, an inorganic material can also be used instead of the organic insulating material. As for the inorganic material, inorganic $SiO_2$, $SiO_2$ manufactured by a plasma CVD method (PCVD—$SiO_2$), SOG (Spin On Glass; a coated silicon oxide film), or the like is used.

Figure 9:
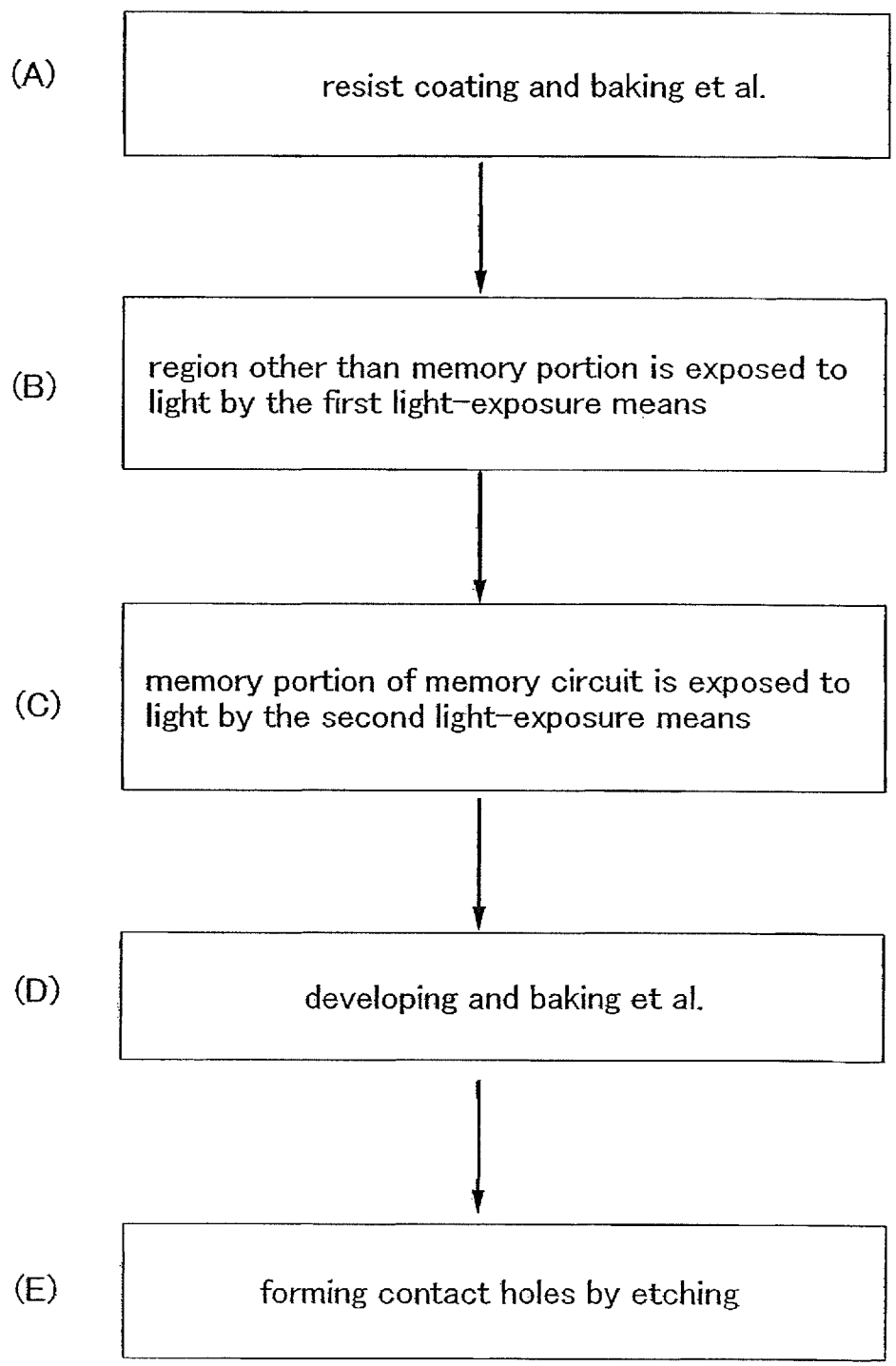
FIG. 9 is a flow chart of a manufacturing method of a semiconductor device.

Subsequently, a resist is provided over the second interlayer insulating film 3025 to form contact holes 3031 and 3032 in the gate insulating film 3006, the first interlayer insulating film 3024, and the second interlayer insulating film 3025 (FIG. 8). In this embodiment, an etching step of a portion other than the memory portion of the nonvolatile memory circuit is performed by a first light-exposure means (for example, mirror projection light-exposure, step and repeat light-exposure (stepper light-exposure), step and scan light-exposure, or the like). By the above first light-exposure means, the resist provided over the second interlayer insulating film 3025 is exposed to light, a pattern is formed, and etching is performed with the use of the resist as masks (FIG. 9). In these steps, first, the upper surface of the second interlayer insulating film 3025 is coated with the resist and baking is performed as shown in (A) of FIG. 9. Then, the resist at the position other than the memory portion of the nonvolatile memory circuit is exposed to light by the above first light-exposure means, that is, mirror projection light-exposure, step and repeat light-exposure, step and scan light-exposure, or the like: therefore, a pattern is formed ((B) of FIG. 9). Such a light-exposure means is extremely effective in exposing many of the same patterns to light.

Then, the resist is exposed to light by a second light-exposure means with the use of the laser irradiation apparatuses shown in Embodiment Modes 1 to 3 to form patterns of the contact holes of the memory portion of the nonvolatile memory circuit or patterns of the contact holes of the memory portion and part of a chip of the nonvolatile memory circuit ((C) of FIG. 9). In FIG. 8, contact holes 3033 of the memory portion are formed by the second light-exposure means.

Next, after process of developing or the like ((D) of FIG. 9) is performed, the interlayer insulating films are etched to form the contact holes 3031, 3032, and 3033, the patterns of which are formed by the first light-exposure means and the second light-exposure means ((E) of FIG. 9).

Then, electrodes 3026 and 3027 that each take contact with a source region and a drain region of the island-shaped semiconductor layer in the memory portion are formed. In addition, electrodes 3028, 3029, and 3030 are formed in the same manner in the logic circuit portion.

Through the above explanation, it is described that, in the step of forming the contact holes, a step of forming a plurality of contact holes over the same substrate is performed by combination of the first light-exposure means (mirror projection light-exposure, step and repeat light-exposure, or step and scan light-exposure) and the second light-exposure means (the light-exposure method using the laser irradiation methods shown in Embodiment Modes 1 to 3). However, without limitation to the steps of forming the contact holes, the above method may also be used for steps of forming a source wiring or a drain wiring, a doping step, or other steps. In addition, it is not always necessary to combine the first light-exposure means and the second light-exposure means, and the second light-exposure means may be used in all light-exposure steps. With the use of the second light-exposure means, laser irradiation can be rapidly performed to a desired position as laser irradiation patterns are rapidly switched; thus, a semiconductor device can be manufactured with high precision with a shortened manufacturing time.

In addition, the second light-exposure means is used following the first light-exposure means in the above steps; however, the memory portion may be formed first by the second light-exposure means, and other circuit portions may be formed thereafter by the first light-exposure means.

Through the above steps, the memory portion having a memory element 3034, and the logic circuit portion having an n-channel TFT 3035 with an LDD structure and a p-channel TFT 3036 with a single-drain structure can be formed over the same substrate (see FIG. 8).

Figure 10:
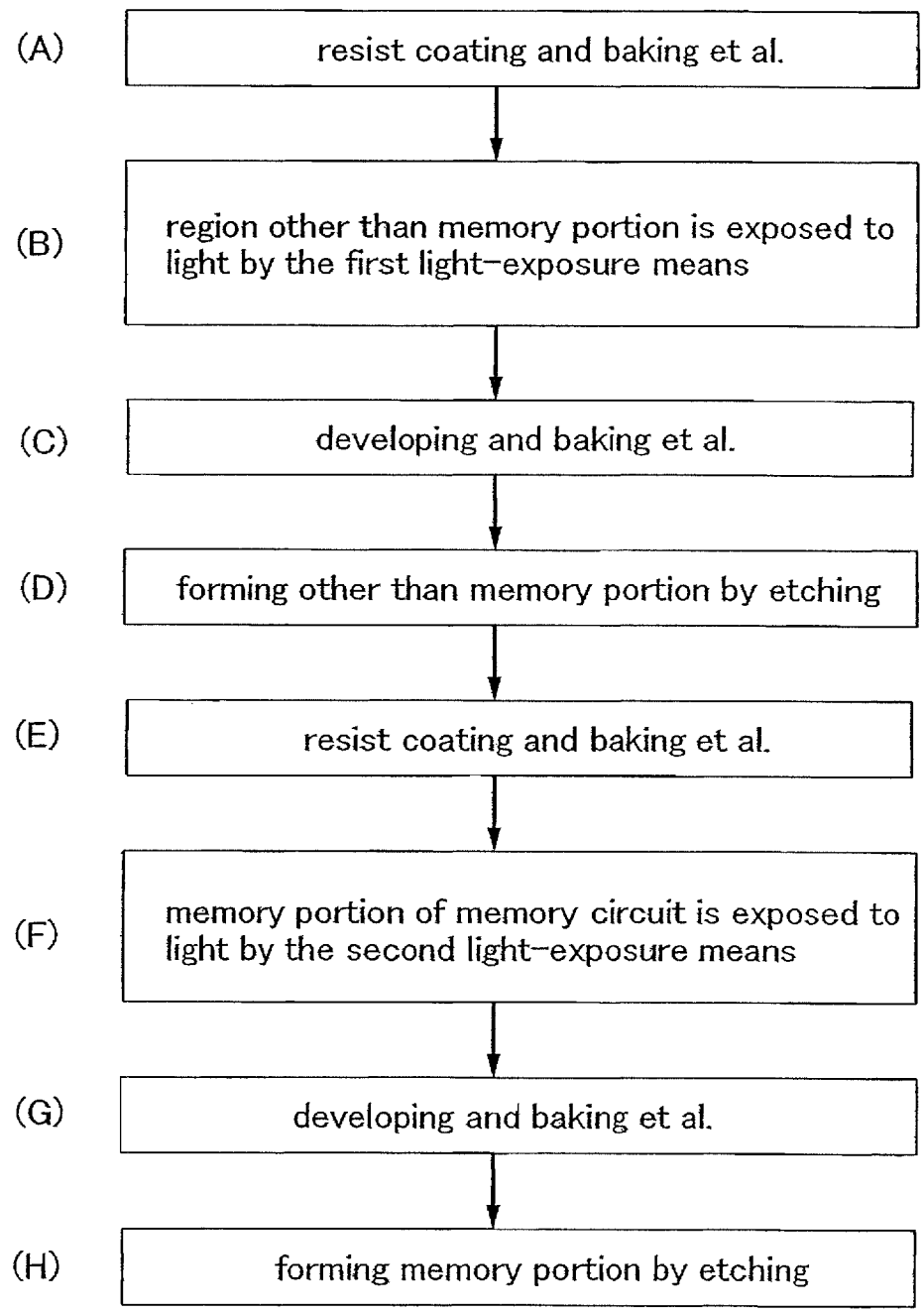
FIG. 10 is a flow chart of a manufacturing method of a semiconductor device.

In addition, as shown in a flow chart of FIG. 10, a region other than the memory portion may be formed first, and thereafter, the memory portion of the nonvolatile memory circuit may be formed. In steps shown in FIG. 10, first, the upper surface of the second interlayer insulating film 3025 is coated with the resist, and baking is performed ((A) of FIG. 10). Next, the resist is exposed to light in order to form a pattern of the region other than the memory portion by a first light-exposure means (mirror projection light-exposure, step and repeat light-exposure, step and scan light-exposure, or the like) ((B) of FIG. 10). Then, developing, baking, and the like are performed to the resist exposed to light by the first light-exposure means ((C) of FIG. 10). Etching is performed to form the pattern of the region other than the memory portion ((D) of FIG. 10). The upper surface of the interlayer insulating film 3025 is coated again with the resist, and baking is performed ((E) of FIG. 10). The resist is exposed to light by a second light-exposure means with the use of the laser irradiation apparatuses shown in Embodiment Modes 1 to 3 to form the pattern of the memory portion of the nonvolatile memory circuit ((F) of FIG. 10). Developing, baking, and the like are performed to the resist exposed to light by the second light-exposure means ((G) of FIG. 10). Last, the memory portion of the nonvolatile memory circuit is formed by etching ((H) of FIG. 10). In such a manner, it becomes possible to manufacture a semiconductor device capable of storing different data to each chip without decreasing throughput. With the use of the laser irradiation apparatuses shown in Embodiment Modes 1 to 3, laser irradiation can be performed to a complicated irradiation point or a plurality of irradiation points at a time with high precision. Therefore, laser irradiation can be performed efficiently in a manufacturing process of a device that requires laser irradiation to a plurality of irradiation points like a manufacturing process of a ROM. Thus, it is possible to easily improve mass productivity in manufacturing a ROM of an ID chip or the like.

Embodiment 2

This embodiment will explain a method for forming a memory portion and a logic circuit portion and transferring them to a flexible substrate with reference to FIGS. 11A and 11B and FIGS. 12A and 12B. Note that this embodiment shows a nonvolatile memory circuit, an n-channel TFT, and a p-channel TFT as examples of a semiconductor element; however, semiconductor elements included in the memory portion and the logic circuit portion in the present invention are not limited thereto. In addition, the manufacturing method is only an example and does not limit a manufacturing method over an insulating substrate.

First, a peeling layer 4000 is formed over an insulating substrate 3000 as shown in FIG. 11A. For the peeling layer 4000, a layer containing silicon as its main component can be used, such as amorphous silicon, poly-crystalline silicon, single-crystalline silicon, or microcrystalline silicon (including semi-amorphous silicon). The peeling layer 4000 can be formed by a sputtering method, a plasma CVD method, or the like. In this embodiment, amorphous silicon is formed with a thickness of approximately 500 nm by a sputtering method to be used as the peeling layer 4000. Subsequently, a base film 3001 is formed over the peeling layer 4000, and thereafter, a memory portion having a memory element 3034 and a logic circuit portion having an n-channel TFT 3035 and a p-channel TFT 3036 are formed in the same manner as the manufacturing process shown in Embodiment 1.

Next, a third interlayer insulating film 4001 is formed over a second interlayer insulating film 3025, and pads 4002 to 4005 are formed. A conductive material including one or a plurality of metals such as Ag, Au, Cu, Pd, Cr, Mo, Ti, Ta, W, or Al, or metal compounds thereof can be used for the pads 4002 to 4005.

Then, a protective layer 4006 is formed over the third interlayer insulating film 4001 so as to cover the pads 4002 to 4005. The protective layer 4006 is formed of a material which is capable of protecting the pads 4002 to 4005 when the peeling layer 4000 will be subsequently removed by etching. For example, the entire surface is coated with an epoxy resin, an acrylate resin, or a silicon resin which is soluble to water or alcohol so that the protective layer 4006 can be formed (FIG. 11A).

Next, a trench 4007 is formed in order to separate the peeling layer 4000 (see FIG. 11B). The trench 4007 is only required to be deep enough so that the peeling layer 4000 is exposed. A method such as etching, dicing, or scribing can be used to form the trench 4007.

Figure 12A:
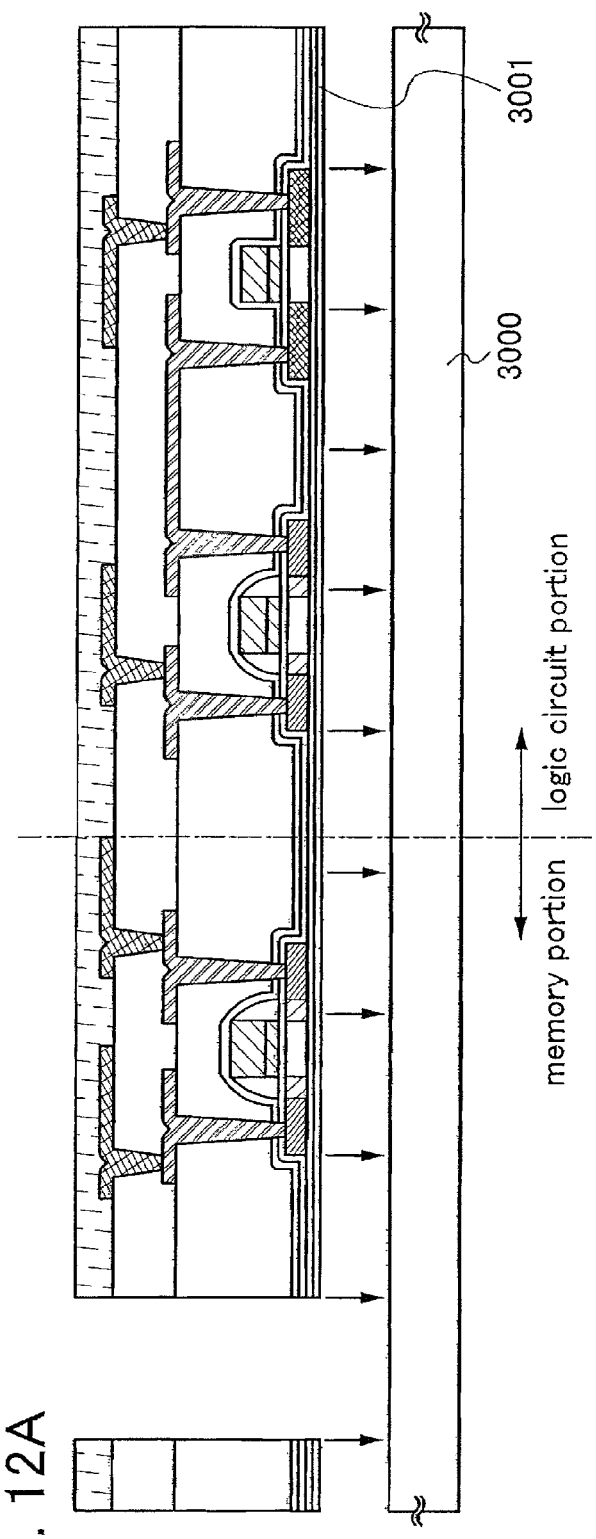
FIGS. 12A and 12B are views each showing a manufacturing process of a semiconductor device.

Then, the peeling layer 4000 is removed by etching (see FIG. 12A). In this embodiment, halogen fluoride is used as an etching gas, which is injected from the trench 4007. In this embodiment, for example, $ClF_3$ (chlorine trifluoride) is used for etching in accordance with the following condition: a temperature of 350° C., a flow rate of 300 sccm, a pressure of 800 Pa, and a processing time of 3 hours. Alternatively, a mixed gas of nitrogen and $ClF_3$ may also be used. By using halogen fluoride such as $ClF_3$, the peeling layer 4000 is selectively etched to be able to peel off the insulating substrate 3000. Note that halogen fluoride may be either gas or liquid.

Figure 12B:
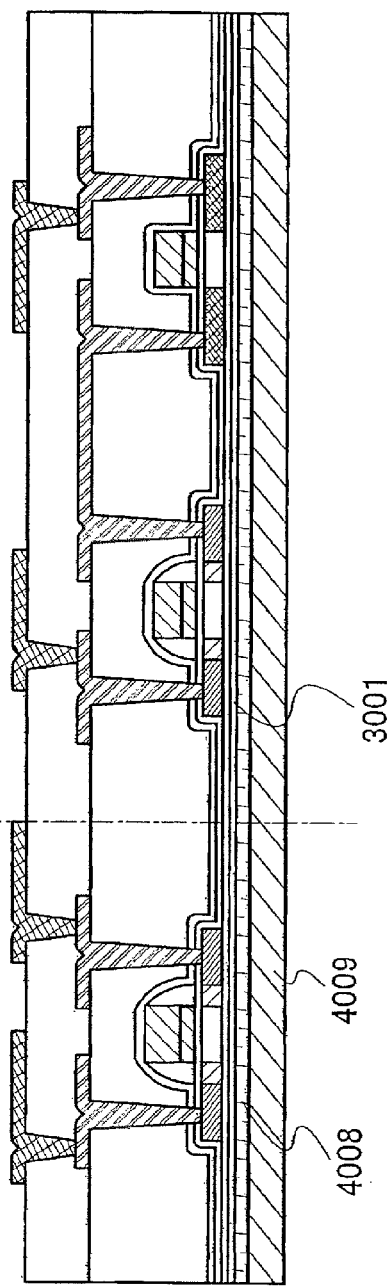

Next, the peeled memory portion and logic circuit portion are attached to a support 4009 with an adhesive agent 4008 (see FIG. 12B). As the adhesive agent 4008, a material which can attach the support 4009 and the base film 3001 to each other is used. For example, various curable adhesive agents can be used, such as a reactive curable adhesive agent, a thermosetting adhesive agent, a photo-curing adhesive agent such as an ultraviolet curable adhesive agent, or an anaerobic adhesive agent.

For the support 4009, an organic material such as flexible paper or flexible plastic can be used. A flexible inorganic material may also be used as the support 4009. In order to diffuse heat generated in an integrated circuit, the support 4009 preferably has high heat conductivity of approximately 2 to 30 W/mK.

Note that, as for the method for peeling off integrated circuits in the memory portion and the logic circuit portion from the insulating substrate 3000, the present invention is not limited to the method using etching of a layer containing silicon as its main component as described in this embodiment, and other various methods can be used. For example, a metal oxide film is provided between a substrate having high heat resistance and the integrated circuit, and then crystallized to be weakened so that the integrated circuit can be peeled off from the substrate. Alternatively, for example, a peeling layer may be broken by laser light irradiation so that the integrated circuit is peeled off from the substrate. Alternatively, for example, a substrate where the integrated circuit is formed may be removed in a mechanical manner or may be removed by etching using a solution or a gas so that the integrated circuit can be peeled off from the substrate.

In a case where a surface of an object curves and a support of an ID chip attached to the curving surface is bent so as to have a curve drawn by move of a generatrix like a conical surface or a circular cylindrical surface, it is preferable that the direction of the generatrix and the direction of a carrier flow of a TFT be identical. According to the above structure, the bending of the support less affects the characteristics of the TFT. Furthermore, in an island-shaped semiconductor film that is formed to occupy an area ratio of 1 to 30% of an integrated circuit, the characteristics of the TFT can be further prevented from being affected due to the bending of the support.

In this embodiment, the memory portion is manufactured with the use of the laser irradiation apparatuses shown in Embodiment Modes 1 to 3. Therefore, laser irradiation can be performed to a plurality of irradiation points at a time with high precision, and laser irradiation can be performed efficiently in a manufacturing process of a device that requires laser irradiation to a plurality of irradiation points like a manufacturing process of a ROM. Thus, it is possible to easily improve mass productivity in manufacturing a ROM of an ID chip or the like.

Embodiment 3

Figure 13:
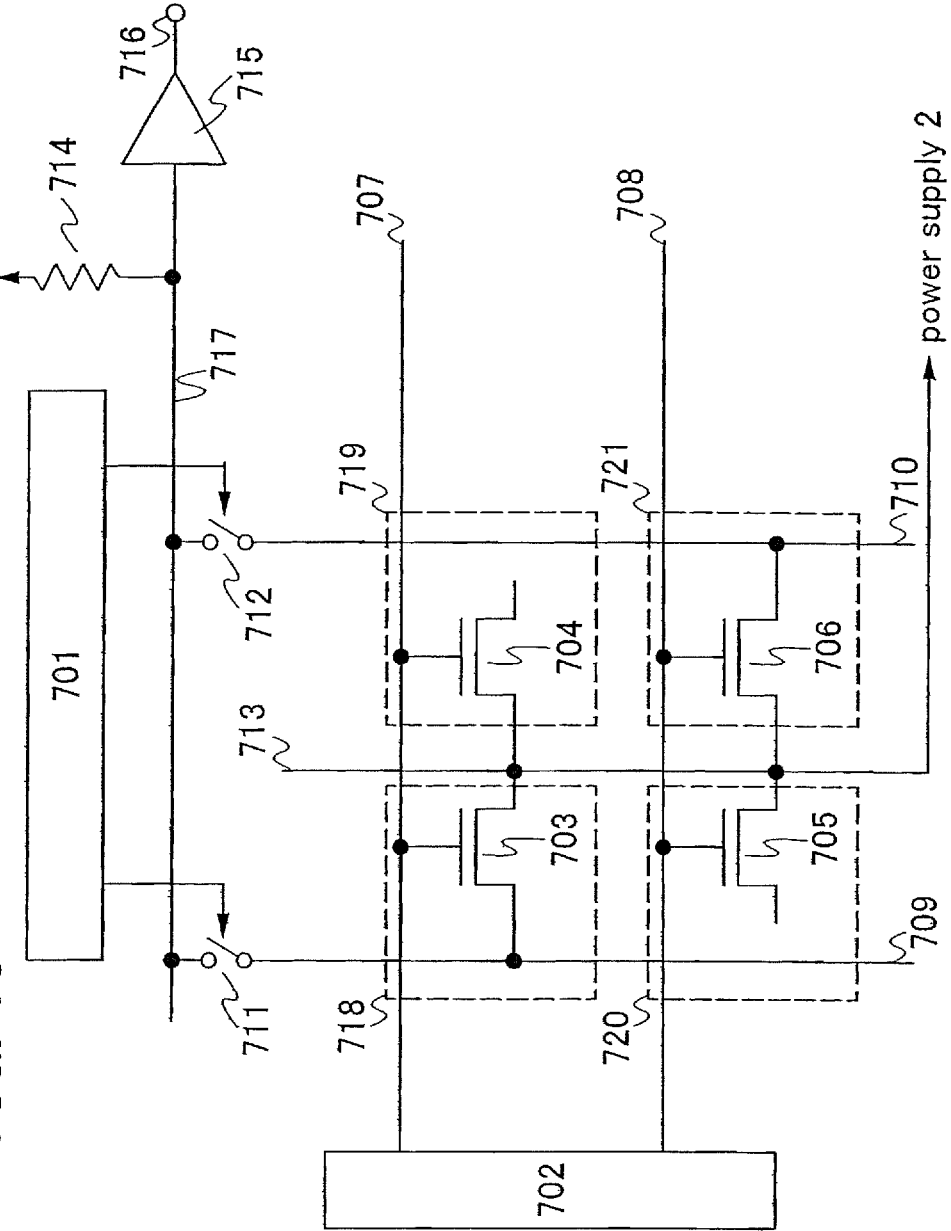
FIG. 13 is a diagram showing a configuration of a nonvolatile memory circuit.

Next, FIG. 13 shows an embodiment of a nonvolatile memory circuit using a mask ROM. The nonvolatile memory circuit shown in FIG. 13, which is manufactured using the laser irradiation apparatus of the present invention, indicates a storage state depending on whether a contact hole is opened in a drain terminal of a TFT.

Hereinafter, the operation of the nonvolatile memory circuit using a mask ROM will be explained with reference to FIG. 13. In FIG. 13, a 4-bit memory circuit is shown as the nonvolatile memory circuit for simplicity; however, the present invention is not limited to the 4-bit memory circuit. The nonvolatile memory circuit shown in FIG. 13 includes a column decoder 701, a row decoder 702, an amplifier 715, n-channel TFTs 703 to 706, bit lines (data lines) 709 and 710, word lines 707 and 708, a power supply line 713, column switches 711 and 712, an output wiring 717, a load resistor 714, an output terminal 716, power supplies 1 and 2. Instead of the load resistor 714, a constant current source may also be used.

The power supply 1 sets high potential, whereas the power supply 2 sets low potential. However, in a case of the TFTs 703 to 706 being p-channel TFTs, the power supply 1 sets low potential whereas the power supply 2 sets high potential. In the following explanation, the TFTs 703 to 706, for which n-channel TFTs are used, have a structure where +3 V is supplied by the power supply 1 and 0 V is supplied by the power supply 2; however, these conditions may be changed arbitrarily. Memory cells 718 to 721 are each constituted by the TFTs 703 to 706.

A case of reading data will be explained below. When data of the memory cell 718 is read, the row decoder 702 is operated to activate the word line 707; therefore, the TFTs 703 and 704 are turned on. Then, the column decoder 701 is operated to turn on the column switch 711; therefore, the bit line (data line) 709 is connected to the output wiring 717, the load resistor 714, and the amplifier 715. Since the TFT 703 is turned on, a current flows to the power supply 2 through the power supply 1, the load resistor 714, the output wiring 717, the column switch 711, the bit line 709, the TFT 703, and the power supply line 713. Accordingly, the memory cell 718 outputs a low signal.

When data of the memory cell 719 is read, the row decoder 702 is operated to activate the word line 707; therefore, the TFTs 703 and 704 are turned on. Then, the column decoder 701 is operated to turn on the column switch 712; therefore, the bit line (data line) 710 is connected to the output wiring 717, the load resistor 714, and the amplifier 715. Although the TFT 703 is turned on, a drain terminal of the TFT 704 is not connected to anywhere; thus, no current flows. Since no current flows whereas the potential of the power supply 1 is supplied to the load resistor 714, the output wiring 717, the column switch 712, and the bit line 710, the memory cell 719 outputs a high signal.

When data of the memory cell 720 is read, the row decoder 702 is operated to activate the word line 708; therefore, the TFTs 705 and 706 are turned on. Then, the column decoder 701 is operated to turn on the column switch 711; therefore, the bit line 709 is connected to the output wiring 717, the load resistor 714, and the amplifier 715. Although the TFT 705 is turned on, a drain terminal of the TFT 705 is not connected to anywhere; thus, no current flows. Since no current flows whereas the potential of the power supply 1 is supplied to the load resistor 714, the output wiring 717, the column switch 711, and the data line 709, the memory cell 720 outputs a high signal.

When data of the memory cell 721 is read, the row decoder 702 is operated to activate the word line 708; therefore, the TFTs 705 and 706 are turned on. Then, the column decoder 701 is operated to turn on the column switch 712; therefore, the bit line 710 is connected to the output wiring 717, the load resistor 714, and the amplifier 715. Since the TFT 706 is turned on, a current flows to the power supply 2 through the power supply 1, the load resistor 714, the output wiring 717, the column switch 712, the bit line 710, the TFT 706, and the power supply line 713. Accordingly, the memory cell 721 outputs a low signal. In such a manner, the data stored to the memory can be read to the output terminal 716.

Embodiment 4

This embodiment will explain an example where an external antenna is provided to a nonvolatile memory circuit formed using the present invention with reference to FIGS. 14A to 14E and FIGS. 15A to 15C.

Figure 14A:
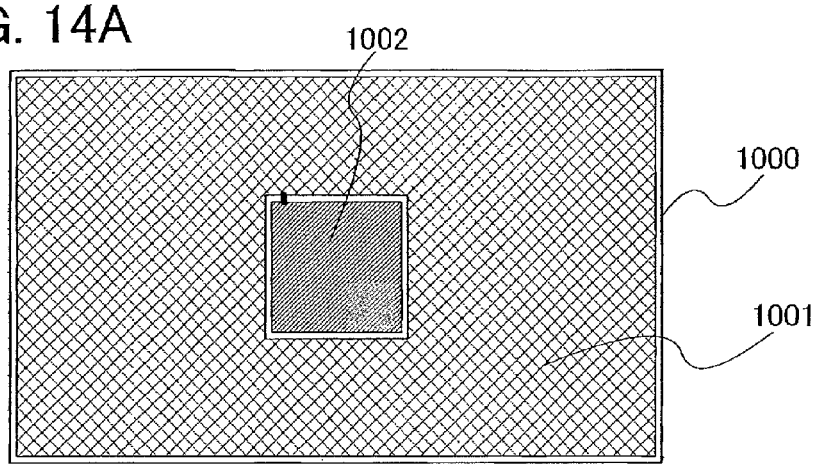
FIGS. 14A to 14E are views each showing an embodiment of an antenna.

FIG. 14A shows a case where a nonvolatile memory circuit is surrounded by a sheet of antenna. An antenna 1001 is formed over a substrate 1000, and a nonvolatile memory circuit 1002 formed using the present invention is connected thereto. In FIG. 14A, the nonvolatile memory circuit 1002 is surrounded by the antenna 1001; however, the antenna 1001 may cover the entire surface of the substrate and the nonvolatile memory circuit 1002 with electrodes may be attached thereto.

Figure 14B:
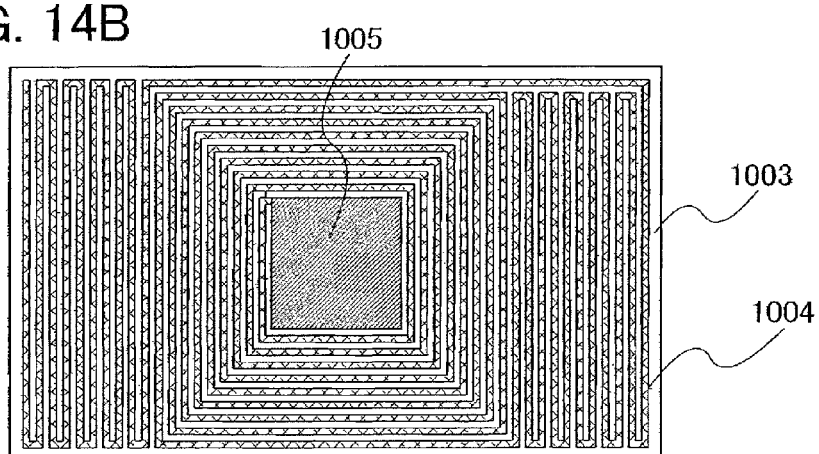

FIG. 14B shows a case where a thin antenna is disposed so as to surround a nonvolatile memory circuit. An antenna 1004 is formed over a substrate 1003, and a nonvolatile memory circuit 1005 formed using the present invention is connected thereto. Note that a wiring of the antenna is not limited thereto.

Figure 14C:
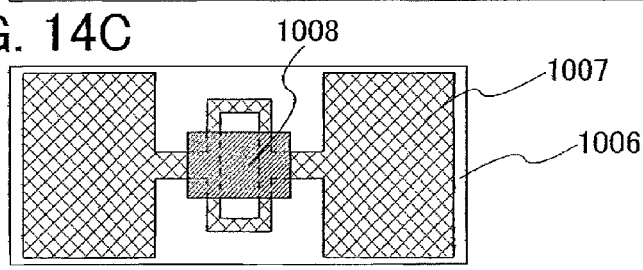

FIG. 14C shows a high frequency antenna. An antenna 1007 is formed over a substrate 1006, to which a nonvolatile memory circuit 1008 formed using the present invention is connected.

Figure 14D:
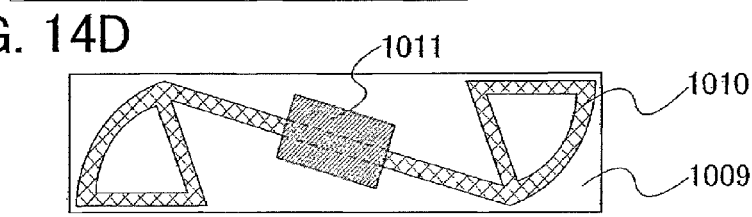

FIG. 14D shows an antenna which is omni-directional (capable of receiving radio waves from any direction) within 180°. An antenna 1010 is formed over a substrate 1009, to which a nonvolatile memory circuit 1011 formed using the present invention is connected.

Figure 14E:
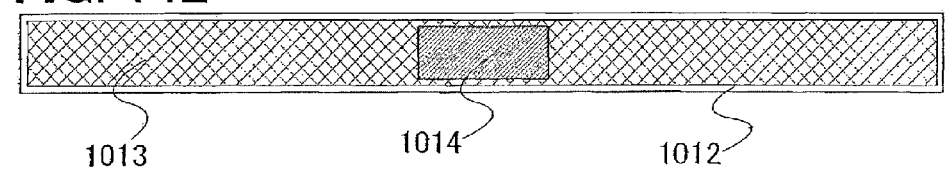

FIG. 14E shows a case where an antenna is in a shape of a long bar. An antenna 1013 is formed over a substrate 1012, to which a nonvolatile memory circuit 1014 formed using the present invention is connected.

The nonvolatile memory circuit formed using the present invention and these antennas can be connected by a known method. For example, the antenna and the nonvolatile memory circuit may be connected by wire bonding or bump bonding. Alternatively, a surface of the nonvolatile memory circuit formed as a chip may be used as an electrode to be attached to the antenna. In this method, the nonvolatile memory circuit can be attached to the antenna with the use of an ACF (anisotropic conductive film).

An appropriate length of the antenna is different depending on the frequency used for reception. It is generally preferable that the antenna be as long as an integer fraction of the wavelength. For example, in a case where the frequency is 2.45 GHz, the length of the antenna may be approximately 60 mm (½ wavelength) or approximately 30 mm (¼ wavelength).

Figure 15A:
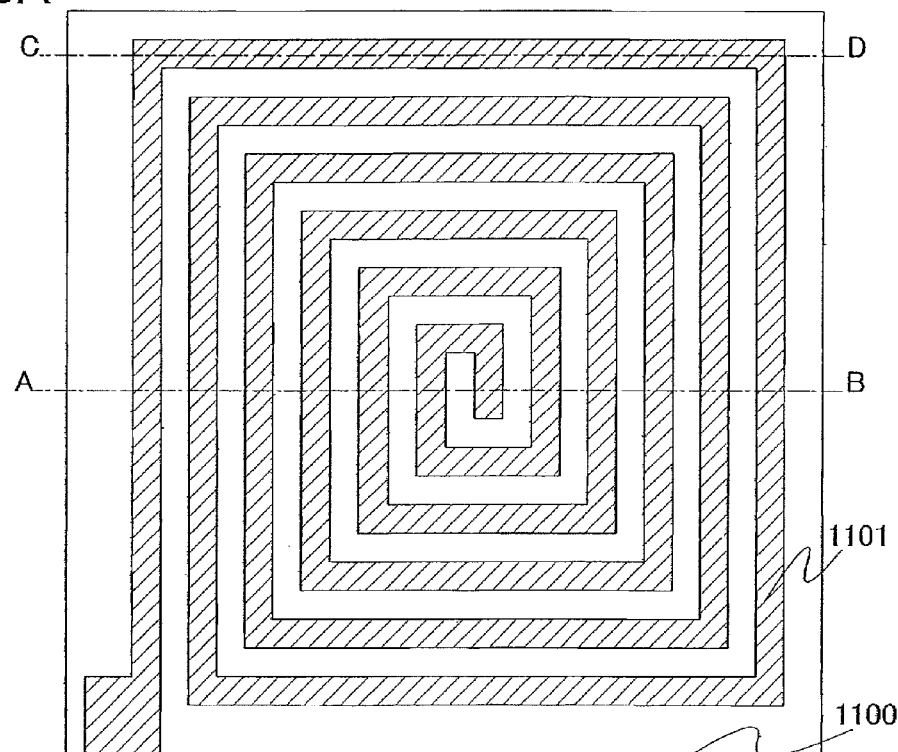
FIGS. 15A to 15C are views each showing an embodiment of an antenna.
Figure 15B:
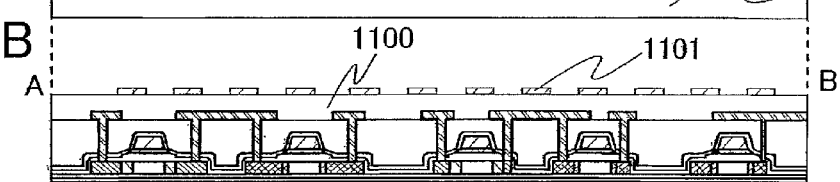
Figure 15C:
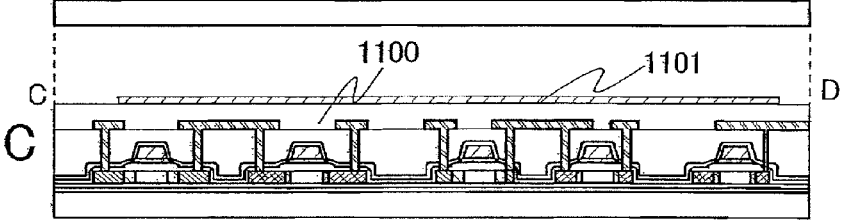

In addition, another substrate may be attached onto the nonvolatile memory circuit of the present invention, and an antenna may be further formed thereover. As an example thereof, FIGS. 15A to 15C show a top view and cross-sectional views of a nonvolatile memory circuit onto which a substrate 1100 is attached and over which a spiral antenna 1101 is provided. FIGS. 15B and 15C show cross-sectional views taken along broken lines A-B and C-D respectively of the top view shown in FIG. 15A.

Note that this embodiment describes only an example and does not limit the shape of the antenna. The present invention can be implemented with any form of antenna.

Embodiment 5

This embodiment will explain a specific manufacturing method of a thin film integrated circuit device including a TFT with reference to FIGS. 16A to 16E, FIGS. 17A to 17D, and FIGS. 18A and 18B. For simplicity, the manufacturing method will be explained herein by description of a cross-sectional structure of a CPU (a logic circuit portion) and a memory portion using an n-channel TFT and a p-channel TFT.

Figure 16A:
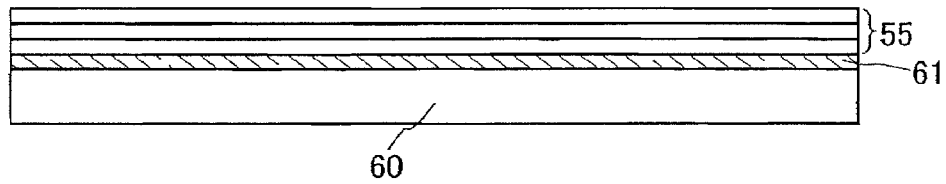
FIGS. 16A to 16E are views each showing a manufacturing process of a semiconductor device.

First, a peeling layer 61 is formed over a substrate 60 (FIG. 16A). The peeling layer 61 here is formed of an a-Si film (an amorphous silicon film) with a thickness of 50 nm over a glass substrate (for example, a 1737 substrate manufactured by Corning Inc.) by a low-pressure CVD method. As for the substrate 60, a quartz substrate, a substrate made of an insulating material such as alumina, a silicon wafer substrate, a plastic substrate having enough heat resistance to the treatment temperature in the subsequent step, or the like can be used as well as the glass substrate.

As for the peeling layer 61, a film containing silicon as its main component is preferably used, such as poly-crystalline silicon, single-crystalline silicon, SAS (semi-amorphous silicon which is also referred to as micro-crystalline silicon) as well as amorphous silicon; however, the present invention is not limited thereto. The peeling layer 61 may be formed by a plasma CVD method, a sputtering method, or the like as well as a low-pressure CVD method. In addition, a film doped with an impurity such as phosphorous may also be used. The thickness of the peeling layer 61 is preferably 50 to 60 nm, and as for SAS, the thickness may be 30 to 50 nm.

Next, a protective film 55 (also referred to as a base film or a base insulating film) is formed over the peeling layer 61 (FIG. 16A). Here, the protective film 55 has a three-layer structure of a SiON (silicon oxide containing nitrogen) film with a thickness of 100 nm, a SiNO (silicon nitride containing oxygen) film with a thickness of 50 nm, and a SiON film with a thickness of 100 nm which are sequentially stacked over the peeling layer 61; however, a material, the thickness, and the number of stacked layers are not limited thereto. For example, instead of the lowest SiON film, a heat-resistant resin such as siloxane may also be formed with a thickness of 0.5 to 3 μm by a spin coating method, a slit coating method, a droplet discharging method, or the like. Alternatively, a silicon nitride film ($SiN$, $Si_3N_4$, or the like) may also be used. Instead of the uppermost SiON film, a silicon oxide film may also be used. In addition, each thickness is preferably 0.05 to 3 μm and can be arbitrarily selected within this range.

Here, a silicon oxide film can be formed by a method such as thermal CVD, plasma CVD, atmospheric pressure CVD, or bias ECR-CVD with the use of a mixed gas such as $SiH_4/O_2$, TEOS (tetraethoxy silane)/$O_2$, and the like. A silicon nitride film can be typically formed by a plasma CVD method with the use of a mixed gas of $SiH_4/NH_3$. The SiON film or the SiNO film can be typically formed by plasma CVD with the use of a mixed gas of $SiH_4/N_2O$ Note that, in the case where a material containing silicon as its main component such as a-Si is used for the peeling layer 61 and an island-shaped semiconductor film 57, $SiOxNy$ (x>y>0) may be used as the protective film 55 to contact them in order to ensure adhesiveness.

Then, a thin film transistor (TFT) for forming a CPU (a logic circuit portion) or a memory portion of a thin film integrated circuit device is formed over the protective film 55. Note that a thin film active element such as an organic TFT or a thin film diode can also be formed as the TFT.

Figure 16B:
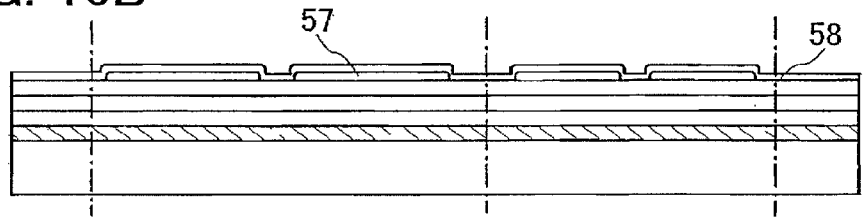

As a method for forming the TFT, first, the island-shaped semiconductor film 57 is formed over the protective film 55 (FIG. 16B). The island-shaped semiconductor film 57 is formed of an amorphous semiconductor, a crystalline semiconductor, or a semi-amorphous semiconductor. In any case, a semiconductor film containing silicon, silicon germanium (SiGe), or the like as its main component can be used.

Here, an amorphous silicon film is formed with a thickness of 70 nm and further a surface thereof is treated with a solution containing nickel. A thermal crystallization step is performed at temperatures of 500 to 750° C. so that a crystalline silicon semiconductor film is formed. Then, the crystallinity thereof is improved by laser crystallization. As a forming method of the semiconductor film, plasma CVD, sputtering, LPCVD, or the like may be used. As a crystallization method of the semiconductor film, laser crystallization, thermal crystallization, or thermal crystallization using other catalysts (Fe, Ru, Rh, Pd, Os, Ir, Pt, Cu, Au, or the like) may be used, or such methods may be performed alternately a plurality of times.

In addition, as for the crystallization treatment of an amorphous semiconductor film, a continuous-wave laser may be used. In order to obtain a crystal with a large grain size in crystallizing, a solid-state laser capable of continuous wave oscillation is used and it is preferable to apply from a second harmonic to a fourth harmonic of a fundamental wave (the crystallization at this case is referred to as CWLC). Typically, a second harmonic (532 nm) or a third harmonic (355 nm) of a fundamental wave of an Nd:$YVO_4$ laser (a fundamental wave: 1064 nm) may be applied. When a continuous-wave laser is used, laser light emitted from a continuous-wave $YVO_4$ laser of which output is 10 W is converted into a harmonic by a non-linear optical element. In addition, there is also a method for emitting a harmonic by putting an $YVO_4$ crystal or a $GdVO_4$ crystal and a non-linear optical element in a resonator. Then, the laser light is preferably shaped so as to have a beam spot of a rectangular shape or an ellipse shape at an irradiated surface with an optical system to irradiate a subject. In this case, an energy density of approximately 0.01 to 100 $MW/cm^2$ (preferably, 0.1 to 10 $MW/cm^2$) is required. Then, the semiconductor film may be irradiated as being moved relatively to the laser light at a speed of approximately 10 to 2000 cm/s.

Moreover, in a case where a pulsed laser is used, the pulsed laser having a frequency band from several tens to several hundreds Hz is generally used; however, the pulsed laser having an extremely higher oscillation frequency of greater than or equal to 10 MHz may also be used (the crystallization at this case is referred to as MHzLC). It is said that it takes several tens to several hundreds nsec to solidify a semiconductor film completely after the semiconductor film is melted by irradiation of the pulsed laser light. When the pulsed laser light has an oscillation frequency of 10 MHz or more, it is possible to irradiate the next pulsed laser light until the semiconductor film is solidified after it is melted by the previous laser light. Therefore, unlike a case of the conventional pulsed laser, the interface between the solid phase and the liquid phase can be moved continuously in the semiconductor film; therefore, the semiconductor film having a crystal grain grown continuously along the scanning direction is formed. Specifically, it is possible to form an aggregation of crystal grains each of which has a width of approximately 10 to 30 μm in the scanning direction and a width of approximately 1 to 5 μm in a direction perpendicular to the scanning direction. By forming such a crystal grain of a single crystal extended long in the scanning direction, a semiconductor film having few grain boundaries at least in the channel direction of the TFT can be formed.

Note that in a case where siloxane, which is a heat-resistant organic resin, is partially used to the protective film 55, a heat leak from the semiconductor film can be prevented in the above crystallization; therefore, the crystallization can be performed efficiently.

The crystalline silicon semiconductor film is obtained in the above manner. The growth direction of the crystals thereof is preferably aligned in the same direction as the direction of a source region, a channel formation region, and a drain region. The thickness of the crystalline layer thereof is preferably 20 to 200 nm (typically, 40 to 170 nm, and much preferably 50 to 150 nm). Subsequently, an amorphous silicon film for gettering a metal catalyst is formed over the semiconductor film with an oxide film interposed therebetween, and the gettering is performed by heat treatment at 500 to 750° C. Furthermore, in order to control a threshold voltage of a TFT element, boron ion is injected into the crystalline semiconductor film at the amount of about $10^{13}/cm^2$. Etching is performed with a resist used as a mask to form the island-shaped semiconductor film 57.

Note that a crystalline semiconductor film may also be obtained by directly forming a poly-crystalline semiconductor film by an LPCVD (low-pressure CVD) method using disilane ($Si_2H_6$) and germanium fluoride ($GeF_4$) as a material gas. The flow rate ratio of the gas is $Si_2H_6/GeF_4$=20/0.9, the temperature for forming the film is 400 to 500° C., and He or Ar can be used as a carrier gas; however, the present invention is not limited thereto.

Note that a channel region of the TFT is added with hydrogen or halogen of $1 \times 10^{19}$ to $1 \times 10^{22}$ $cm^3$, preferably at $1 \times 10^{19}$ to $5 \times 10^{20}$ $cm^{-3}$. In the case of a SAS, hydrogen or halogen of $1 \times 10^{19}$ to $2 \times 10^{21}$ $cm^{-3}$ is preferably added. In any case, it is preferable that the amount of hydrogen or halogen be larger than that contained in a single crystal used for an IC chip. Accordingly, even in a case where a local crack is generated at the TFT portion, the local crack can be terminated by the hydrogen or halogen.

Next, a gate insulating film 58 is formed over the island-shaped semiconductor film 57 (FIG. 16B). The gate insulating film 58 is preferably formed of a single layer or a stacked layer containing silicon nitride, silicon oxide, silicon nitride oxide, or silicon oxynitride by a method for forming a thin film such as plasma CVD or sputtering. In the case of the stacked layer, a three-layered structure in which a silicon oxide film, a silicon nitride film, and a silicon oxide film are sequentially stacked over the substrate is preferable, for example.

Figure 16C:
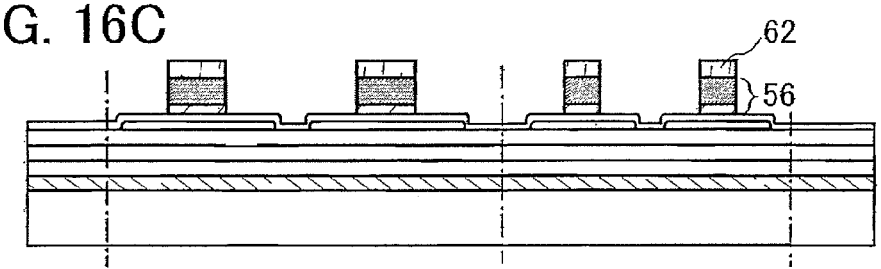
Figure 16D:
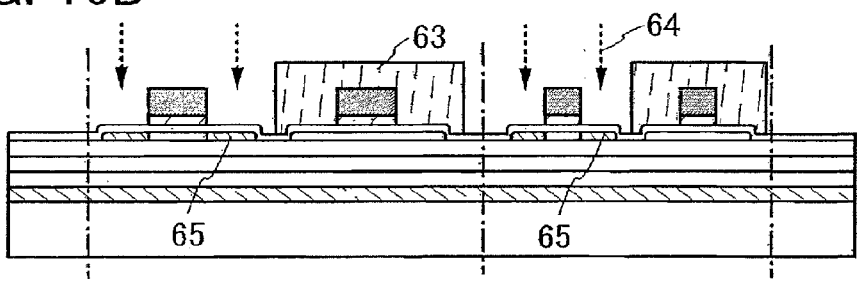
Figure 16E:
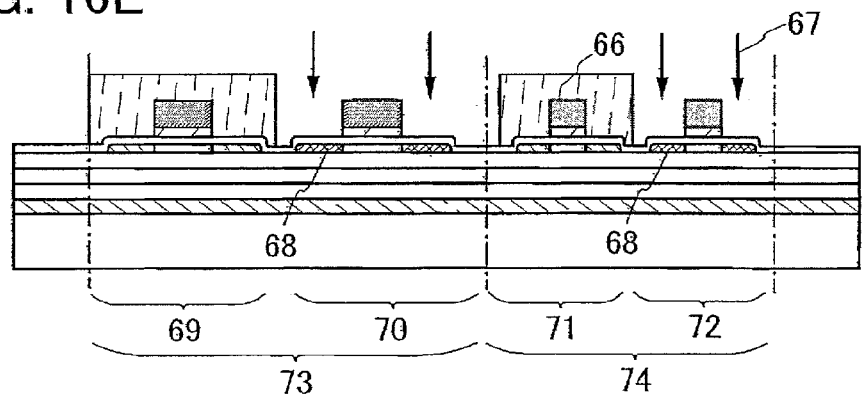

Then, a gate electrode 56 is formed (FIG. 16C). Here, Si and W (tungsten) are stacked by a sputtering method, and are etched with a resist 62 used as a mask to form the gate electrode 56. Needless to say, the material, structure, and forming method of the gate electrode 56 are not limited thereto and can be selected appropriately. For example, a stacked layer structure of Si doped with an impurity imparting n-type conductivity and NiSi (Nickel Silicide), or a stacked layer structure of TaN (tantalum nitride) and W (tungsten) may be employed. Alternatively, the gate electrode may be formed of a single layer using various conductive materials.

A mask of SiOx or the like may be used instead of the resist mask. In this case, a step of forming the mask of SiOx, SiON, or the like (referred to as a hard mask) by patterning is added, while the film of the mask is less decreased in etching compared with the case of the resist mask so that a gate electrode can be formed with a desired width. Alternatively, the gate electrode 56 may be selectively formed with the use of a droplet discharging method without using the resist 62.

As for the conductive material, various kinds of materials can be selected depending on the function of the conductive film. In addition, in the case where the gate electrode 56 and the antenna are formed at the same time, the material may be selected in consideration of their functions.

Note that, as an etching gas in forming the gate electrode 56 by etching, a mixed gas of $CF_4$, $Cl_2$, and $O_2$, or a $Cl_2$ gas is used here; however, the present invention is not limited thereto.

Next, a resist 63 is formed so as to cover portions to be p-channel TFTs 70 and 72. An impurity element 64 imparting n-type conductivity (typically, P (phosphorous) or As (arsenic)) is doped into the island-shaped semiconductor films of n-channel TFTs 69 and 71 at a low concentration with the gate electrode 56 used as a mask (a first doping step, FIG. 16D). The first doping step is performed in accordance with the following condition: the amount of $1\times10^{13}$ to $6\times10^{13}/cm^2$ and an accelerated voltage of 50 to 70 keV; however, the present invention is not limited thereto. In the first doping step, doping is performed through the gate insulating film 58 to form a pair of low concentration impurity regions 65. Note that the first doping step may be performed to the entire surface without covering a p-type TFT region with resist.

After the resist 63 is removed by ashing or the like, a resist 66 is newly formed so as to cover an n-channel TFT region. An impurity element 67 imparting p-type conductivity (typically B (boron)) is doped into the island-shaped semiconductor films of the p-channel TFTs 70 and 72 at a high concentration with the gate electrode used as a mask (a second doping step, FIG. 16E). The second doping step is performed in accordance with the following condition: the amount of $1\times10^{16}$ to $3\times10^{16}/cm^2$ and an accelerated voltage of 20 to 40 keV; however, the present invention is not limited thereto. In the second doping step, the impurity element 67 imparting p-type conductivity is doped through the gate insulating film 58 to form a pair of p-type high concentration impurity regions 68.

Figure 17A:
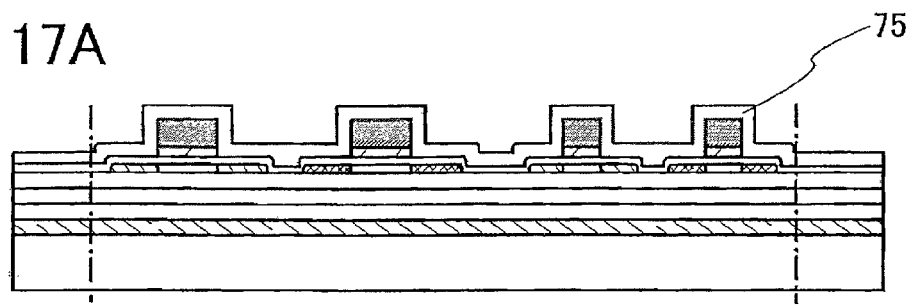
FIGS. 17A to 17D are views each showing a manufacturing process of a semiconductor device.
Figure 17B:
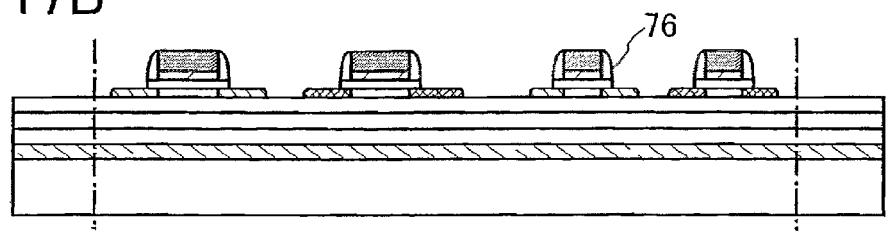
Figure 17C:
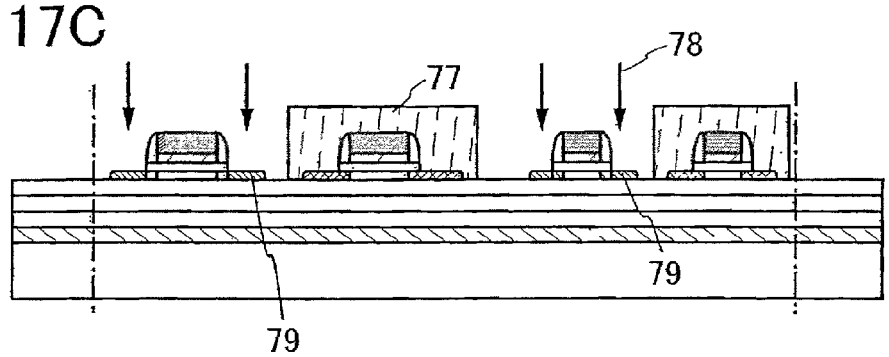

After the resist 66 is removed by ashing or the like, an insulating film 75 is formed over the substrate surface (FIG. 17A). Here, a $SiO_2$ film is formed with a thickness of 100 nm by a plasma CVD method. Then, the insulating film 75 and the gate insulating film 58 are removed by etching with the use of an etch-back method to form a sidewall 76 in a self-aligned manner (FIG. 17B). As an etching gas, a mixed gas of $CHF_3$ and He is used.

Figure 18A:
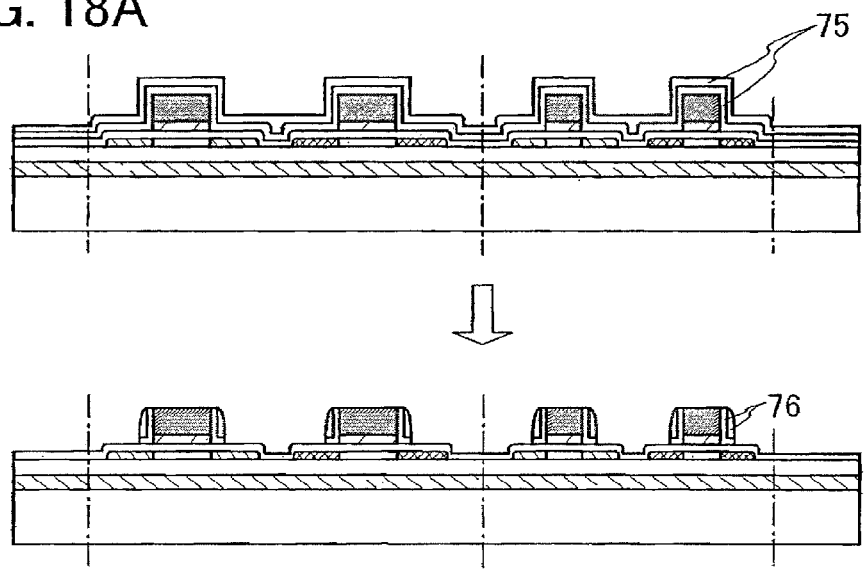
FIGS. 18A and 18B are views each showing a manufacturing process of a semiconductor device.

The forming method of the sidewall 76 is not limited to the above description. For example, methods shown in FIGS. 18A and 18B can be used. FIG. 18A shows an example where the insulating film 75 is formed to have a stacked layer structure of two or more layers. As the insulating film 75, for example, a SiON (silicon oxynitride) film with a thickness of 100 nm and an LTO (Low Temperature Oxide) film with a thickness of 200 nm are stacked to have a two-layer structure. Here, the SiON film is formed by a plasma CVD method, and a $SiO_2$ film is formed by a low-pressure CVD method as the LTO film Thereafter, etch back is performed. Accordingly, the sidewall 76 is formed in which an arc shape and an L shape are formed.

Figure 18B:
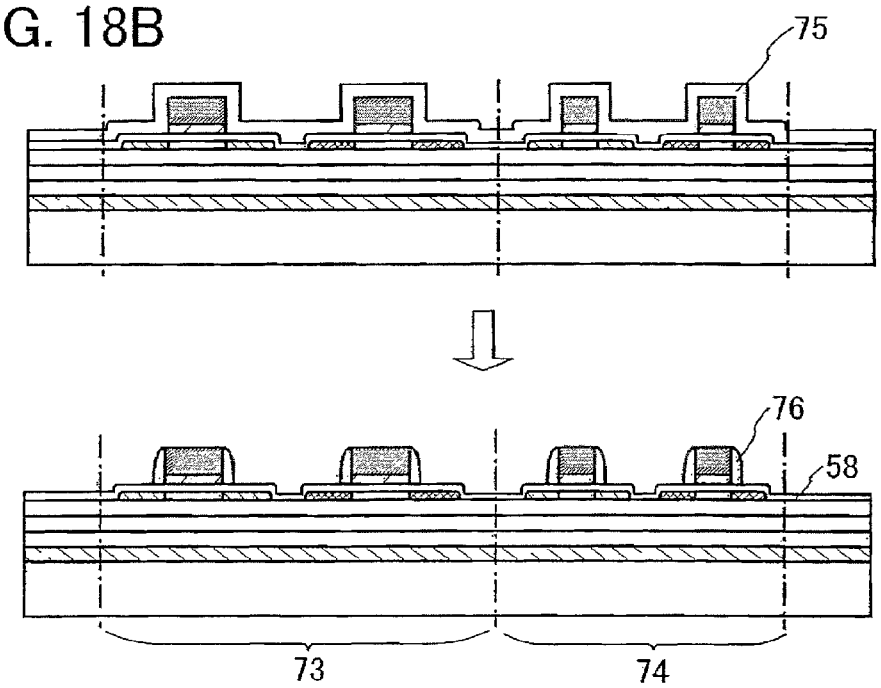

FIG. 18B shows an example where etching is performed so that the gate insulating film 58 is not removed in performing etch back. The insulating film 75 of this case may be formed of a single or stacked layer structure.

The above sidewall is doped with an impurity imparting n-type conductivity at a high concentration in a subsequent step, which serves as a mask when forming a low concentration impurity region or an offset region to which any is not doped is formed under the sidewall 76. In any of the above forming methods of the sidewall, the condition of the etch back may be appropriately changed depending on the width of the low concentration impurity region or the offset region to be formed.

Next, a resist 77 is newly formed so as to cover the P-channel TFT region. An impurity element 78 imparting n-type conductivity (typically, P or As) is doped at a high concentration with the gate electrode 56 and the sidewall 76 used as a mask (a third doping step, FIG. 17C). The third doping step is performed in accordance with the following condition: the amount of $1\times10^{13}$ to $5\times10^{15}/cm^2$ and an accelerated voltage of 60 to 100 keV; however, the present invention is not limited thereto. In the third doping step, the impurity element 78 imparting n-type conductivity is doped to form a pair of n-type high concentration impurity regions 79.

After the resist 77 is removed by ashing or the like, heat activation of the impurity region may be performed. For example, a SiON film is formed with a thickness of 50 nm, and then heat treatment may be performed at 550° C. for 4 hours in a nitrogen atmosphere. In the case where a SiNx film containing hydrogen is formed with a thickness of 100 nm and then heat treatment is performed at 410° C. for an hour in a nitrogen atmosphere, a defect in the crystalline semiconductor film can be improved. This step is performed, for example, to terminate a dangling bond in the crystalline silicon and is referred to as a hydrogenation step or the like. Then, a SiON film is formed with a thickness of 600 nm as a cap insulating film for protecting the TFT. Note that the hydrogenation step may be performed after the SiON film is formed. In this case, a SiNx film and a SiON film formed thereover can be continuously formed. In such a manner, three-layer insulating films are formed in the order of SiON, SiNx, and SiON from the substrate side over the TFT; however, the structure and material are not limited thereto. It is preferable that such an insulating film be formed because it also serves to protect the TFT.

Figure 17D:
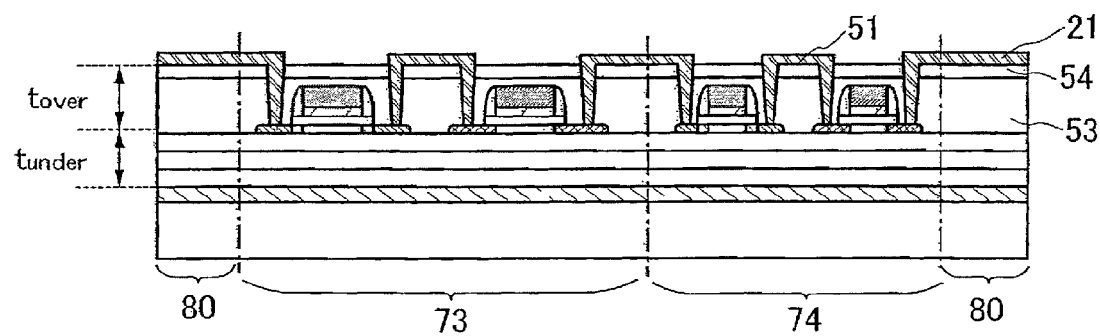

Next, an interlayer film 53 is formed over the TFT (FIG. 17D). For the interlayer film 53, polyimide, acrylic, polyamide, and a heat-resistant organic resin such as siloxane can be used. As for the forming method, spin coating, dipping, spray coating, droplet discharging (inkjet method, screen printing, offset printing, or the like), a doctor knife, a roll coater, a curtain coater, a knife coater, or the like can be employed depending on its material. Alternatively, an inorganic material may be used such as a film of silicon oxide, silicon nitride, silicon oxynitride, PSG (phosphor silicate glass), BPSG (boro-phospho silicate glass), or alumina. Note that these insulating films may also be stacked to form the interlayer film 53.

Further, a protective film 54 may be formed over the interlayer film 53. As for the protective film 54, a film containing carbon such as DLC (Diamond Like Carbon) or carbon nitride (CN), a silicon oxide film, a silicon nitride film, a silicon nitride oxide film, or the like can be used. As for the forming method, plasma CVD, atmospheric pressure plasma, or the like can be used. Alternatively, a photosensitive or nonphotosensitive organic material such as polyimide, acrylic, polyamide, resist, or benzocyclobutene, or a heat-resistant organic resin such as siloxane may be used.

Note that a filler may be mixed into the interlayer film 53 or the protective film 54 in order to prevent film detachment or a crack of these films due to stress generated by a difference of a thermal expansion coefficient between the interlayer film 53 or the protective film 54 and a conductive material or the like of a wiring formed in a subsequent step.

Then, after a resist is formed over the interlayer film 53, contact holes are formed by etching, and a wiring 51 for connecting the TFTs to each other and a connection wiring 21 for connecting the TFT to an external antenna are formed (FIG. 17D). In the above step, the contact holes in a memory portion 74 are formed by a second light-exposure means with the use of the laser irradiation apparatuses shown in Embodiment Modes 1 to 3. As for an etching gas for opening the contact holes, a mixed gas of $CHF_3$ and He is used; however, the present invention is not limited thereto. In addition, the wiring 51 and the connection wiring 21 may be formed of the same material at the same time, or may be formed separately. Here, the wiring 51 connected to the TFTs is formed with a five-layer structure, where Ti, TiN, Al—Si, Ti, and TiN are sequentially formed, which is etched after being formed by a sputtering method.

By mixing Si into the Al layer, hillock can be prevented from generating at the resist baking when the wiring is formed. Instead of the Si, Cu of approximately 0.5% may be mixed. In addition, by sandwiching the Al—Si layer by Ti or TiN, hillock resistance can be further improved. In fowling the wiring, the above hard mask of SiON or the like is preferably used. Note that the material and the forming method of the wiring are not limited thereto and the material for forming the above gate electrode 56 may also be used.

In this embodiment, only a TFT region for fainting a CPU 73, the memory portion 74, or the like and a terminal portion 80 for connecting to an antenna are formed over the same substrate. However, this embodiment can also be applied to a case where a TFT region and an antenna are formed over the same substrate. In this case, it is preferable that the antenna be formed over the interlayer film 53 or the protective film 54, and then covered by another protective film. As for the conductive material of the antenna, Ag, Au, Al, Cu, Zn, Sn, Ni, Cr, Fe, Co, Ti, or an alloy thereof can be used; however, the present invention is not limited thereto. The wiring and the antenna may be formed by different materials from each other. In addition, it is preferable that the wiring and the antenna be formed so as to contain a metal material having high ductility and malleability, and much preferably, the thickness thereof is increased in order to withstand the stress due to deformation.

As for the forming method of the antenna, the film may be formed over the entire surface by a sputtering method and etched with a resist mask, or may be selectively formed by a droplet discharging method with the use of a nozzle. The droplet discharging method here includes offset printing, screen printing, or the like in addition to an inkjet method. The wiring and the antenna may be formed at the same time, or may be formed separately so that one of them is formed first, and then the other is formed so as to overlap.

Through the above steps, a thin film integrated circuit device including a TFT is completed. In this embodiment, a top gate structure is employed; however, a bottom gate structure (an inversely staggered structure) may also be employed. In a region except the thin film active element portion (an active element) such as a TFT, a base insulating film material, an interlayer insulating film material, and a wiring material are mainly provided. The region occupies preferably 50% or more, and much preferably 70 to 95% of the whole thin film integrated circuit device. Accordingly, the IC chip can be easily bent; therefore, its completed product like ID label can be easily handled. In this case, an island-shaped semiconductor film (an island) of the active element including the TFT portion occupies preferably 1 to 30%, and much preferably 5 to 15% of the whole thin film integrated circuit device.

In addition, as shown in FIG. 17D, the thickness of the protective film or the interlayer film is preferably adjusted so that a distance ($t_{under}$) between the semiconductor layer of the TFT and the lower protective film, and a distance ($t_{over}$) of the semiconductor layer to the upper interlayer film (or the protective film if formed) are the same or almost the same in the thin film integrated circuit device. By disposing the semiconductor layer in the middle of the thin film integrated circuit device in such a manner, stress applied to the semiconductor layer can be relieved; therefore, generation of a crack can be prevented.

In this embodiment, the memory portion is manufactured with the use of the laser irradiation apparatuses shown in Embodiment Modes 1 to 3. Therefore, laser irradiation can be performed to a plurality of irradiation points at a time with high precision, and laser irradiation can be performed efficiently in a manufacturing process of a device that requires laser irradiation to a plurality of irradiation points like a manufacturing process of a ROM. Thus, it is possible to easily improve mass productivity in manufacturing a ROM of an ID chip or the like.

Embodiment 6

A memory element manufactured using the present invention can be applied to an IC card, an IC tag, an RFID, a transponder, paper money, a valuable instrument, a passport, an electronic device, a bag, and clothing. This embodiment will explain examples of an IC card, an ID tag, an ID chip, and the like with reference to FIGS. 19A to 19H.

Figure 19A:
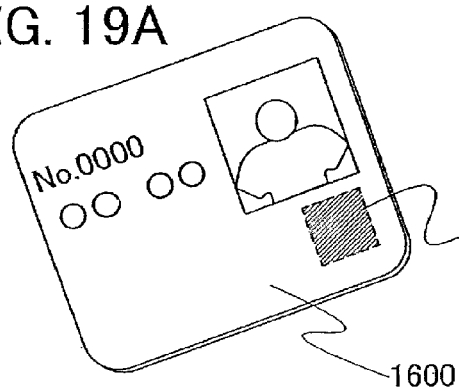
FIGS. 19A to 19H are views each showing an application of a semiconductor device manufactured according to the present invention.

FIG. 19A shows an IC card which can be used for identification of an individual and as a credit card or electronic money whereby payment can be made without using cash by utilizing a rewritable memory in an incorporated circuit. A nonvolatile memory circuit 1601 using the present invention is incorporated in an IC card 1600.

Figure 19B:
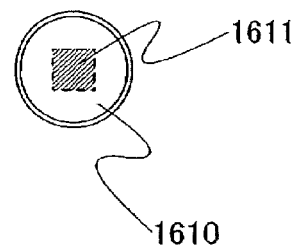

FIG. 19B shows an ID tag which can be used for identification of an individual, for management of entrance at a specific place, and the like by virtue of its compactness. A nonvolatile memory circuit 1611 using the present invention is incorporated in an ID tag 1610.

Figure 19C:
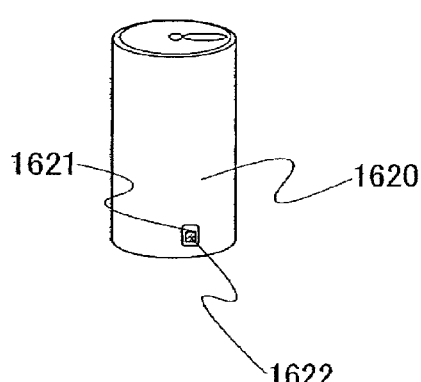

FIG. 19C shows an example where an ID chip 1622 is attached to merchandise 1620 for merchandise management in handling merchandise at a retail store such as a supermarket. The present invention is applied to a memory circuit in the ID chip 1622. By attachment of the ID chip 1622 to the merchandise 1620 in such a manner, not only the inventory management is simplified, but also shoplifting and the like can be prevented. In FIG. 19C, a protective film 1621, which also has adhesion, is provided to prevent the ID chip 1622 from being detached; however, the ID chip 1622 may be directly attached to the merchandise 1620 by an adhesive agent. Moreover, it is preferable that a flexible substrate as mentioned in Embodiment 2 be used for forming the ID chip 1622 in view of the structure where the ID chip 1622 is attached to the merchandise 1620.

Figure 19D:
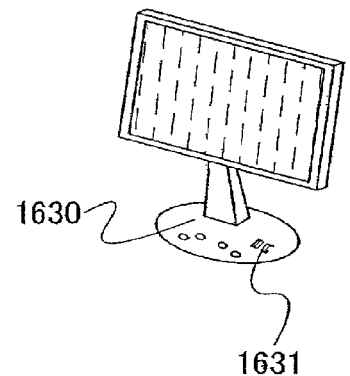

FIG. 19D shows an example where an ID chip for identification is incorporated in merchandise when being manufactured. In FIG. 19D, an ID chip 1631 is incorporated in a housing 1630 of a display as an example. The present invention is applied to a memory circuit in the ID chip 1631. With such a structure, identification, a distribution management, or the like of merchandise can be simplified in a manufacturer. Note that a housing of a display is taken as an example in FIG. 19D; however, the present invention is not limited thereto and can be applied to various electronic devices and objects.

Figure 19E:
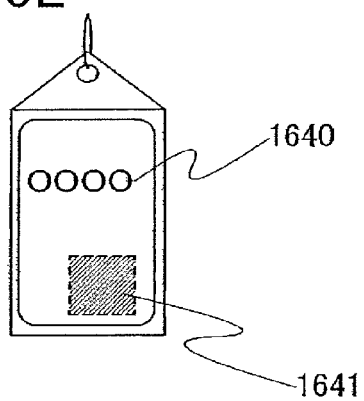

FIG. 19E shows a shipping tag for transporting objects. In FIG. 19E, an ID chip 1641 is incorporated in a shipping tag 1640. The present invention is applied to a memory circuit in the ID chip 1641. With such a structure, selection of destination and distribution management of merchandise can be simplified. Note that the shipping tag is fastened to an object with a string in FIG. 19E; however, the present invention is not limited thereto, and the tag may be directly attached to an object with a sealing material or the like.

Figure 19F:
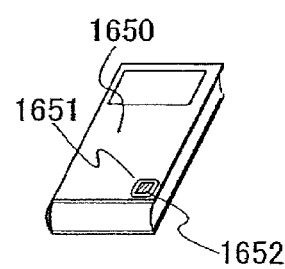

FIG. 19F shows an ID chip 1652 incorporated in a book 1650. The present invention is applied to a memory circuit in the ID chip 1652. With such a structure, distribution management at a bookstore, circulation management at a library, or the like can be simplified. In FIG. 19F, a protective film 1651, which also has adhesion, is used to prevent the ID chip 1652 from being detached; however, the ID chip 1652 may be directly attached to the book 1650 by an adhesive agent, or the ID chip 1652 may be embedded in a book cover of the book 1650.

Figure 19G:
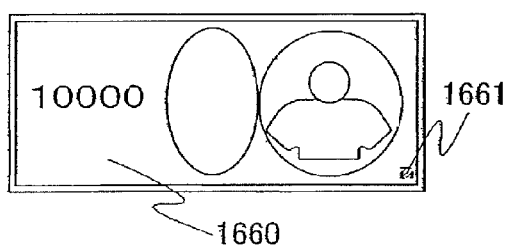

FIG. 19G shows an ID chip 1661 incorporated in a paper money 1660. The present invention is applied to a memory circuit in the ID chip 1661. With such a structure, circulation of counterfeit paper money can be prevented easily. Note that the ID chip 1661 is preferably embedded in the paper money 1660 to prevent the ID chip 1661 from being detached due to the nature of paper money. The present invention can be applied to an object made of paper such as a valuable instrument and a passport as well as paper money.

Figure 19H:
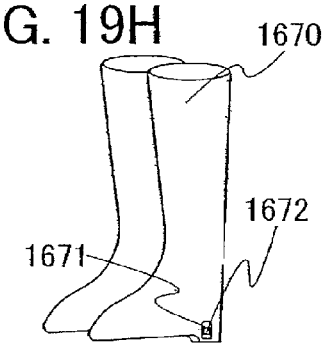

FIG. 19H shows an ID chip 1672 incorporated in a pair of shoes 1670. The present invention is applied to a memory circuit in the ID chip 1672. With such a structure, identification, distribution management, or the like of merchandise can be simplified in a manufacturer. In FIG. 19H, a protective film 1671, which also has adhesion, is provided to prevent the ID chip 1672 from being detached; however, the ID chip 1672 may be directly attached to merchandise by an adhesive agent, or the ID chip 1672 may be embedded in the pair of shoes 1670. The present invention can be applied to an object such as clothing and a bag as well as a pair of shoes.

Next, a case where an ID chip is mounted on various objects in order to protect the security thereof, for example, on purpose to prevent theft or prevent counterfeit, will be explained.

Figure 20:
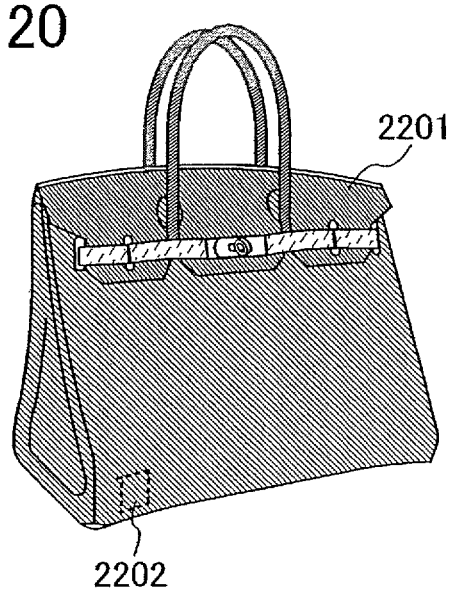
FIG. 20 is a view showing a bag using a semiconductor device manufactured according to the present invention.

As an example of using an ID chip on purpose to prevent theft, a case where an ID chip is mounted on a bag will be explained. The present invention is applied to a memory circuit in an ID chip 2202. As shown in FIG. 20, the ID chip 2202 is mounted on a bag 2201. For example, the ID chip 2202 can be mounted on the bottom, part of the side, or the like of the bag 2201. The ID chip 2202 that is very thin and compact can be mounted without spoiling the design of the bag 2201. Moreover, the ID chip 2202 has transmittance; thus, it is difficult to judge whether the ID chip 2202 is mounted. Therefore, the ID chip 2202 is scarcely detached by a stealer.

When such a bag 2201 provided with the ID chip 2202 is stolen, information on a present position of the bag 2201 can be obtained by means of a GPS (Global Positioning System), for example. Note that GPS is a system to position depending on a time difference obtained from a signal received from a GPS satellite.

As for such a case where the bag 2201 is left behind or lost other than the case of the theft, information on the present position can be obtained by means of a GPS.

The ID chip can be mounted on a vehicle such as an automobile or a bicycle, a watch, or an accessory, as well as the bag 2201.

Next, as an example of using an ID chip on purpose to prevent theft, a case where an ID chip is mounted on a passport, a certificate, or the like will be explained.

Figure 21A:
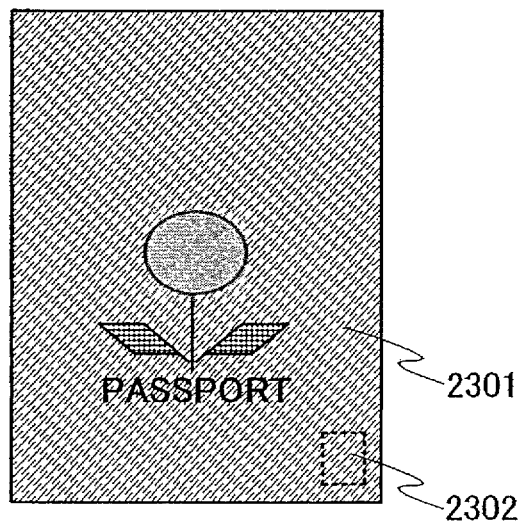
FIGS. 21A and 21B are views each showing a certificate using a semiconductor device manufactured according to the present invention.

FIG. 21A shows a passport 2301 with an ID chip. In FIG. 21A, an ID chip 2302 is mounted to a cover of the passport 2301; however, it may be mounted on another page and may be mounted on a surface of the cover because the ID chip 2302 has transmittance. Alternatively, the ID chip 2302 may be embedded in the cover so as to be sandwiched by a material for the cover or the like.

Figure 21B:
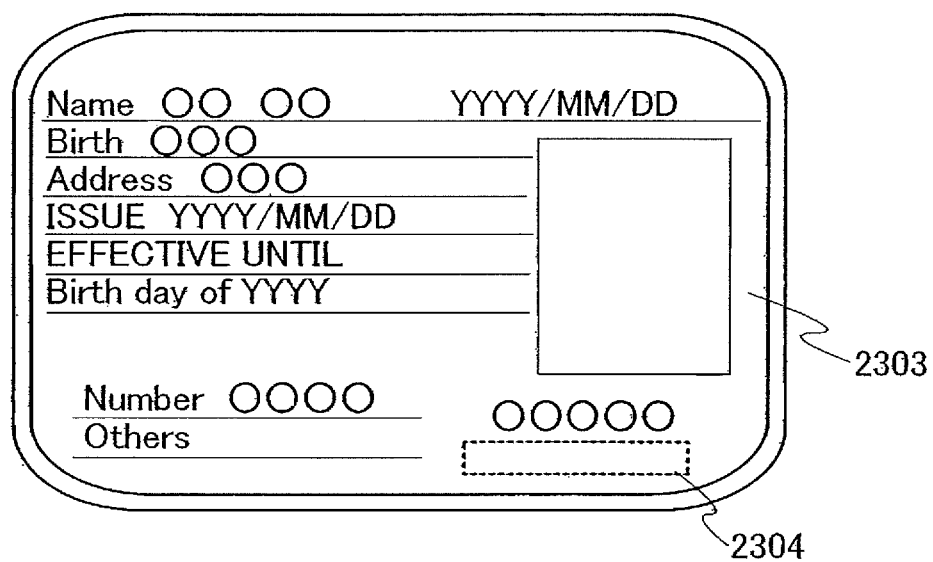

FIG. 21B shows a certificate 2303 provided with an ID chip. In FIG. 21B, an ID chip 2304 is embedded in the certificate 2303. The ID chip 2304, which has transmittance, may be mounted on a print side of the certificate 2303. For example, the ID chip 2304 is mounted on the print side of the certificate 2303, thermosetting resin films are disposed above and below the certificate 2303 so as to sandwich the certificate 2303, and the films are thermally pressure-bonded so that the certificate 2303 with the ID chip 2304 can be covered with the films Alternatively, the ID chip 2304 can be mounted in the certificate 2303 so as to be sandwiched by a material for the certificate 2303.

By mounting an ID chip on these objects, counterfeit thereof can be prevented. The ID chip that is very thin and compact can be mounted without spoiling the design of a passport, a certificate, or the like. Further, the ID chip has transmittance; thus, it may be mounted on the surface thereof.

In addition, according to the ID chip mounted on merchandise, supervision of the passport, the certificate, or the like can be simplified. Further, data can be recorded in the ID chip without writing directly in the passport, the certificate, or the like; therefore, our privacy can be protected.

Next, a case where an ID chip is mounted on merchandise such as groceries for safety control will be explained with reference to FIG. 22.

Figure 22:
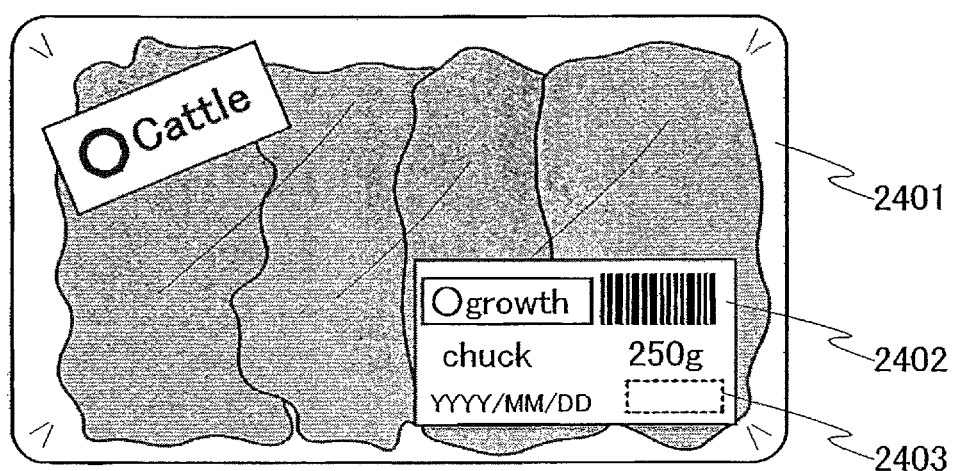
FIG. 22 is a view showing groceries control using a semiconductor device manufactured according to the present invention.

FIG. 22 shows a label 2402 with an ID chip 2403 and a package for meat 2401 to which the label 2402 is attached. The ID chip 2403 may be mounted on a surface of the label 2402 or embedded in the label 2402. In a case of a fresh food such as vegetables, an ID chip may be mounted on a wrap for the fresh food.

The ID chip 2403 can record a basic matter of the merchandise such as place of production, producer, pack date, and expiration date. Such a basic matter that is not required to be rewritten may be recorded in a memory which is incapable of rewriting such as an MROM. Further, the ID chip 2403 can record an applied matter such as cooking example using the merchandise. Such an applied matter may be recorded in a memory such as an EEPROM capable of rewriting and erasing.

In addition, for safety control of groceries, it is important that states of pre-processed plants and animals can be obtained. Therefore, an ID chip may be embedded in the plants and animals so that data thereon is obtained by a reader device. The data on plants and animals includes breeding place, feed, breeder, and whether any contagion infects it.

In addition, in a case where an ID chip records price of the merchandise, checking out can be performed more simply in a shorter time compared to a case where a barcode is used as conventional. That is, plural pieces of merchandise with ID chips can be checked out all at once. However, in the case where a plurality of ID chips are read out in this manner, the reader device is required to be provided with an anti collision function.

Further, the checking out of merchandise is possible even when a distance between a cash register and the merchandise is long, depending on a communication distance of the ID chip. The ID chip can also be used to prevent shoplifting.

Further, an ID chip can be used in combination with another information medium such as a barcode or a magnetic tape. For example, the basic matter that is not required to be rewritten may be recorded in the ID chip, whereas data to be renewed such as data on discounted price or special price may be recorded in the barcode, because the barcode can easily revise unlike the ID chip.

By mounting an ID chip on merchandise as described above, the volume of data for a consumer can be increased.

Figure 23A:
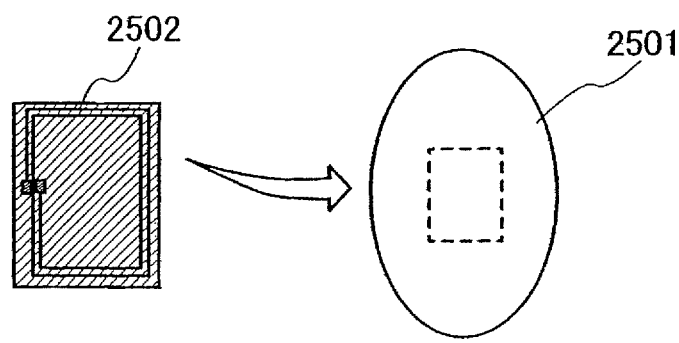
FIGS. 23A and 23B are views each showing distribution management using a semiconductor device manufactured according to the present invention.
Figure 23B:
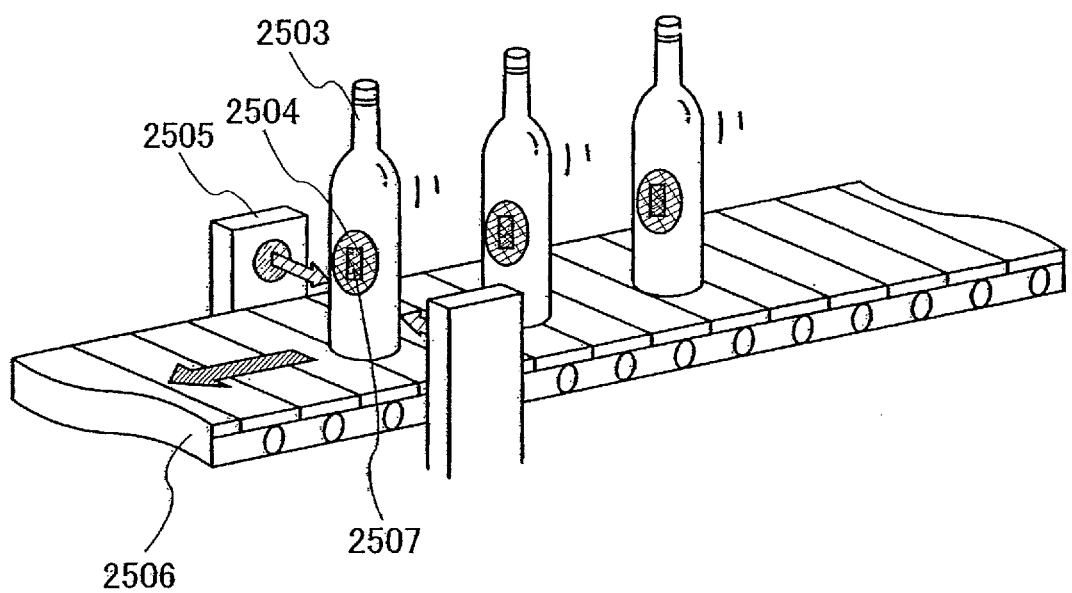

A case where an ID chip is mounted on merchandise such as a beer bottle for distribution management will be explained with reference to FIGS. 23A and 23B. As shown in FIG. 23A, an ID chip 2502 can be mounted on a beer bottle with the use of a label 2501.

The ID chip 2502 records a basic matter such as date manufactured of beer, manufacturing place, and material thereof. Such a basic matter is not required to be rewritten; thus, it may be recorded using a memory which is incapable of rewriting such as a mask ROM. In addition, the ID chip records an individual matter such as address, date and time for delivery of each beer bottle. For example, the address and the date and time for delivery can be recorded in an ID chip 2507 in a label 2504 when each beer bottle 2503 passes through a writer device 2505 with a flow of a belt conveyor 2506 as shown in FIG. 23B. Such an individual matter may be recorded using a memory such as an EEPROM capable of rewriting and erasing.

In addition, a system may be built, in which, when data on the merchandise purchased is sent from a delivery address to a distribution management center through network, a writer device, a personal computer, or the like for controlling the writer device calculates address, and date and time for delivery to be recorded in the ID chip.

In addition, in general, a beer bottle or the like is delivered per case. Therefore, it is also possible that an ID chip is mounted per case or per a plurality of cases to record an individual matter.

When an ID chip is mounted on a drinkable to which a plurality of delivery addresses may be recorded, time required for manual data input can be reduced, resulting in reduced input errors. In addition, it is possible to lower labor costs that are the most costly expenses in the distribution management. Thus, the mounting of the ID chip enables the distribution management with few errors at low cost.

Further, an applied matter such as groceries matched with beer and a recipe using beer can be recorded by a receiver. Consequently, advertisement of the groceries or the like can also be made, which can enhance buying inclination of the consumers. Such an applied matter may be recorded using a memory such as an EEPROM capable of rewriting and erasing. By mounting an ID chip as described above, the volume of data for a consumer can be increased; therefore, the consumer can purchase the merchandise without anxiety.

An article of manufacture with an ID chip and a manufacturing apparatus (a manufacturing robot) controlled based on data of the ID chip for manufacturing control will be explained.

In a case of producing original merchandise, an ID chip is mounted on merchandise in a manufacture line so as to be able to produce such merchandise that is based on original data recorded in the ID chip. For example, in a manufacture line of an automobile in which a painting color of a door is selected freely, an ID chip is mounted on part of an automobile and painting apparatus can be controlled based on data from the ID chip.

As a result of mounting an ID chip on part of an automobile as described above, the sequence of automobiles to be put into the manufacture line and the number of automobiles to have the same color are not required to be adjusted in advance. Consequently, any program for controlling the painting apparatus so as to correspond to the sequence and the number of automobiles is not required to be set. In other words, the manufacturing apparatus can operate individually based on data of the ID chip that is mounted on each automobile.

As described above, an ID chip can be used in various places. Individual data on manufacture can be obtained from data recorded in the ID chip so that a manufacturing apparatus can be controlled based on the data.

Figure 24:
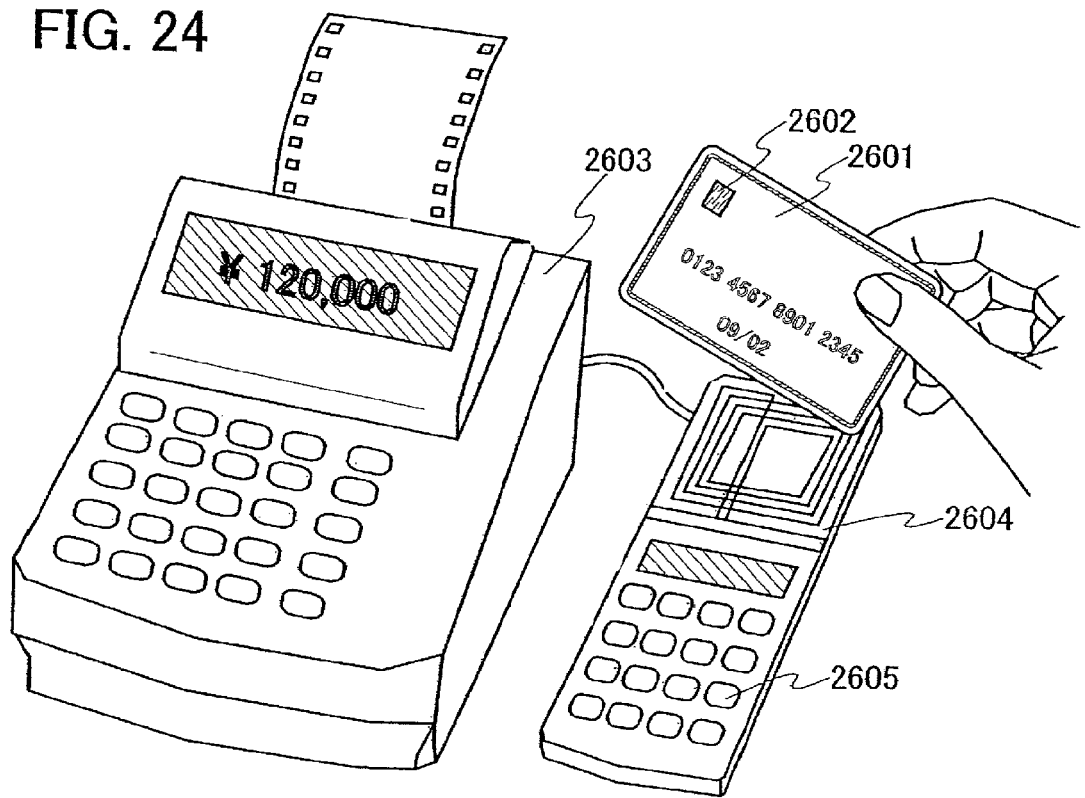
FIG. 24 is a view showing IC card settlement using a semiconductor device manufactured according to the present invention.

Next, a mode utilizing an IC card using an ID chip according to the present invention as electronic money will be explained. In FIG. 24, settlement is performed by using an IC card 2601. The IC card 2601 has an ID chip 2602 according to the present invention. In utilizing the IC card 2601, a register 2603 and a reader/writer 2604 are used. The sum of money of the IC card 2601 is stored in the ID chip 2602, and the data on the sum can be read in a non-contact manner by the reader/writer 2604 to be sent to the register 2603. The register 2603 makes certain that the sum of money of the IC card 2601 is larger than the settlement amount to perform the settlement. Then, remaining amount data of the IC card 2601 after the settlement is sent to the reader/writer 2604. The reader/writer 2604 can write the remaining amount data into the ID chip 2602 of the IC card 2601.

The reader/writer 2604 may be provided with a key 2605 for inputting a password so that unauthorized settlement using the IC card 2601 by a third party can be restricted.

Note that this embodiment describes only one example and the present invention is not limited to these applications.

Through the above, an application range of the present invention is so wide that the present invention can be applied as a chip for individual identification for various objects.

The present invention is a laser irradiation apparatus capable of drawing an arbitrary pattern by simultaneous irradiation with a plurality of laser beams to an irradiated body, and an irradiation method. The present invention can be applied to a light-exposure step in a semiconductor process as well as to a manufacturing process of a ROM as described above. In addition, the present invention can be applied to a case of performing a desired process (for example, character marking or the like) by irradiation of an irradiated body with a laser beam.

The present application is based on Japanese Patent Application serial No. 2006-026884 filed on Feb. 3, 2006 in Japanese Patent Office, the entire contents of which are hereby incorporated by reference.

What is claimed is:

1. A method for manufacturing a memory element comprising:

forming island-shaped semiconductor layers over a substrate;

forming a first insulating film over the island-shaped semiconductor layers;

forming gate electrodes each overlapping one of the island-shaped semiconductor layers, over the first insulating film;

forming a second insulating film over the gate electrodes;

providing a resist over the second insulating film;

performing a deflection of a first laser beam by a first deflector so that the first laser beam passes through one of first diffractive optical elements to form a first plurality of laser beams;

performing a deflection of a second laser beam by a second deflector so that the second laser beam passes through one of second diffractive optical elements to form a second plurality of laser beams;

irradiating the resist with the first and the second plurality of laser beams; and etching the first insulating film and the second insulating film by development of the resist irradiated with the first and the second plurality of laser beams to selectively form contact holes.

2. The method according to claim 1, wherein each of the first deflector and the second deflector is an acousto-optic deflector or a galvanometer mirror.

3. The method according to claim 1, wherein each of the first diffractive optical elements and the second diffractive optical elements is a transmission-type diffractive optical element or a reflection-type diffractive optical element.

4. The method according to claim 1, wherein the memory element is a read only memory.

5. The method according to claim 1, wherein the memory element is incorporated in at least one of the group consisting of an IC card, an IC tag, an RFID, a transponder, paper money, a valuable instrument, a passport, an electronic device, a bag, and clothing.

* * * * *